(12) United States Patent
Wada et al.

(10) Patent No.: US 8,008,767 B2
(45) Date of Patent: Aug. 30, 2011

(54) SEMICONDUCTOR DEVICE

(75) Inventors: Masahiro Wada, Tokyo (JP); Hiroyuki Tanaka, Tokyo (JP); Hiroshi Hirose, Tokyo (JP); Teppei Itoh, Tokyo (JP); Kenya Tachibana, Tokyo (JP)

(73) Assignee: Sumitomo Bakelight Co., Ltd., Shinagawa-Ku, Tokyo (JP)

( * ) Notice: Subject to any disclaimer, the term of this patent is extended or adjusted under 35 U.S.C. 154(b) by 105 days.

(21) Appl. No.: 12/094,775

(22) PCT Filed: Sep. 5, 2007

(86) PCT No.: PCT/JP2007/067283
§ 371 (c)(1),
(2), (4) Date: Sep. 8, 2008

(87) PCT Pub. No.: WO2008/032620
PCT Pub. Date: Mar. 20, 2008

(65) Prior Publication Data
US 2009/0267212 A1    Oct. 29, 2009

(30) Foreign Application Priority Data
Sep. 13, 2006  (JP) ................................ 2006-248473

(51) Int. Cl.
*H01L 23/18* (2006.01)
*H01L 23/498* (2006.01)
(52) U.S. Cl. ......................................... 257/687; 257/692
(58) Field of Classification Search .................... 257/687
See application file for complete search history.

(56) References Cited

U.S. PATENT DOCUMENTS

| | | | | |
|---|---|---|---|---|
| 5,224,265 A | * | 7/1993 | Dux et al. | 29/852 |
| 6,512,182 B2 | * | 1/2003 | Takeuchi et al. | 174/256 |
| 6,646,350 B2 | * | 11/2003 | Tanaka et al. | 257/759 |
| 7,038,142 B2 | * | 5/2006 | Abe | 174/255 |
| 7,285,321 B2 | * | 10/2007 | Kanakarajan et al. | 428/209 |
| 7,459,782 B1 | * | 12/2008 | Li | 257/702 |
| 7,495,332 B2 | * | 2/2009 | Kariya et al. | 257/702 |
| 2003/0136577 A1 | * | 7/2003 | Abe | 174/255 |

(Continued)

FOREIGN PATENT DOCUMENTS
JP     10158365     6/1998
(Continued)

OTHER PUBLICATIONS

English translation of JP1999116659A.
(Continued)

*Primary Examiner* — N Drew Richards
*Assistant Examiner* — Robert Carpenter
(74) *Attorney, Agent, or Firm* — Laura M. Lloyd; Jeffrey G. Sheldon; Sheldon Mak & Anderson

(57) ABSTRACT

The invention offers technology for suppressing damage to semiconductor devices due to temperature changes. When flip-chip mounting a silicon chip on a buildup type multilayer substrate having a structure with a thinned core, a core having a small coefficient of thermal expansion is used in the multilayer substrate, and the coefficient of thermal expansion and glass transition point of the underfill are appropriately designed in accordance with the thickness and coefficient of thermal expansion of the core. By doing so, it is possible to relieve stresses inside the semiconductor package caused by deformation of the multilayer substrate due to temperature changes, and thereby to suppress damage to the semiconductor package due to temperature changes.

7 Claims, 10 Drawing Sheets

U.S. PATENT DOCUMENTS

2005/0151270 A1* 7/2005 Jones ........................... 257/783
2005/0252682 A1* 11/2005 Shimoto et al. ............... 174/260
2007/0298260 A1* 12/2007 Kanakarajan et al. ..... 428/411.1

FOREIGN PATENT DOCUMENTS

| JP | 1999116659 A | 4/1999 |
|---|---|---|
| JP | 11233571 | 8/1999 |
| JP | 200250718 | 2/2002 |
| JP | 200435668 | 2/2004 |
| JP | 2004134679 | 4/2004 |
| JP | 2005236067 | 2/2005 |
| JP | 2005236220 | 2/2005 |
| JP | 2005097524 A | 4/2005 |
| JP | 2005254680 | 9/2005 |
| JP | 2006024842 | 1/2006 |
| JP | 2006080356 | 3/2006 |

OTHER PUBLICATIONS

English translation of JP2005097524A.
Notice of Rejection dated Mar. 29, 2011 in Patent App. No. 2008534303.

* cited by examiner

[Fig. 1]
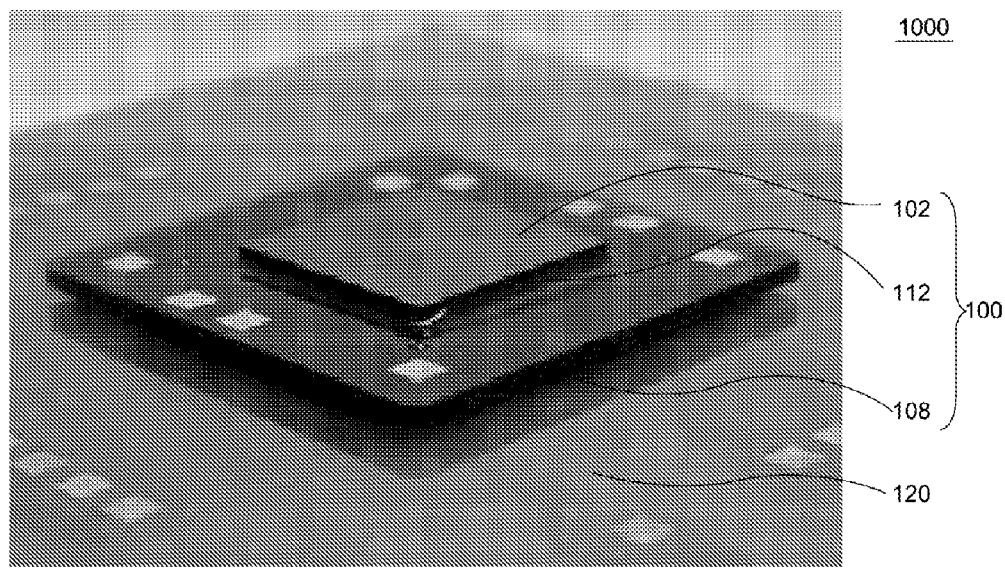
[Fig. 2]
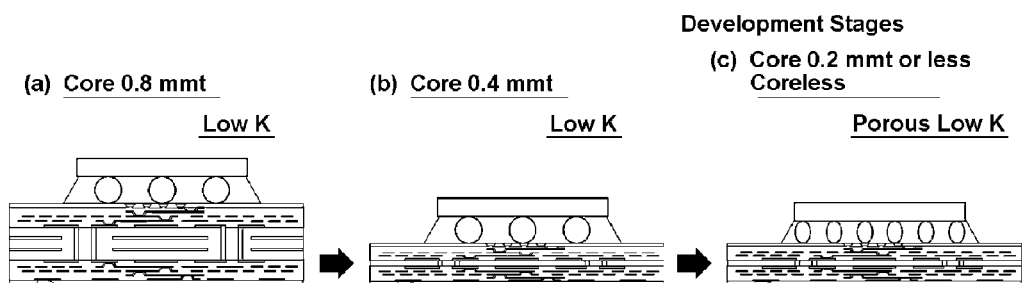

[Fig. 3]
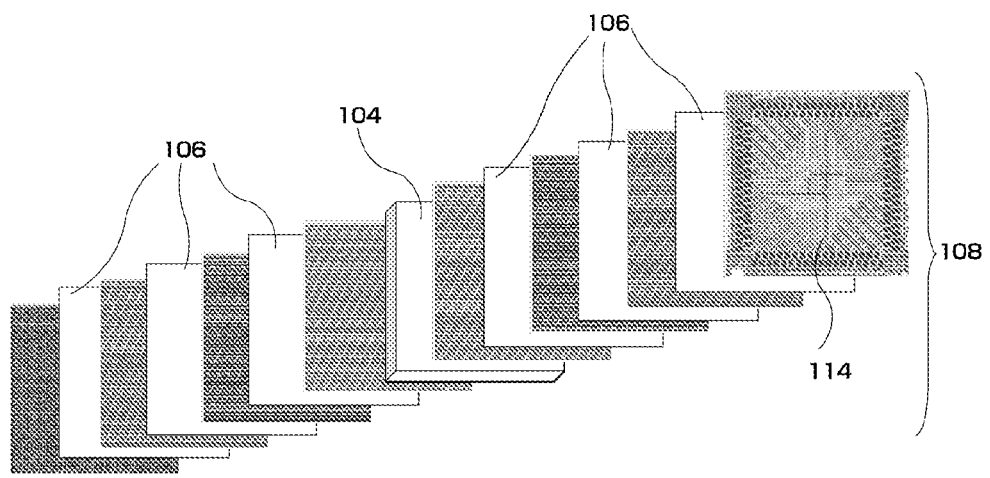

[Fig. 4]
(a)
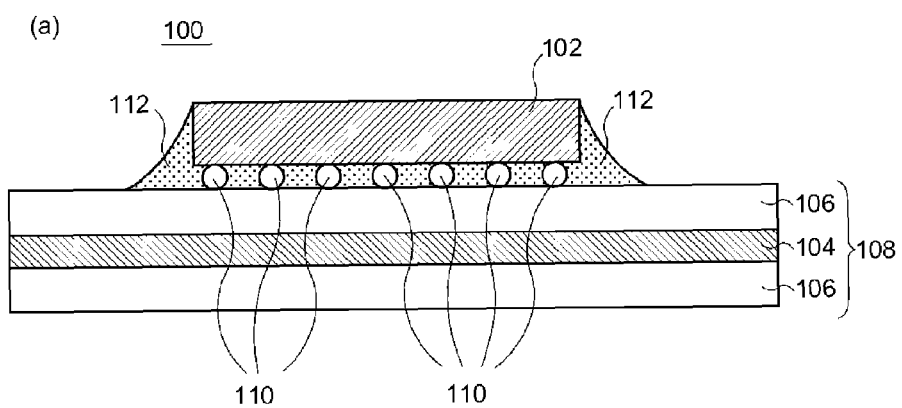
(b)
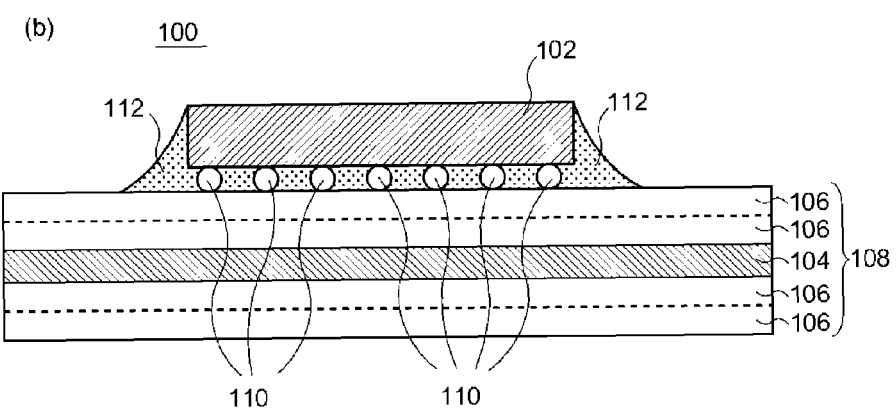

[Fig. 4]
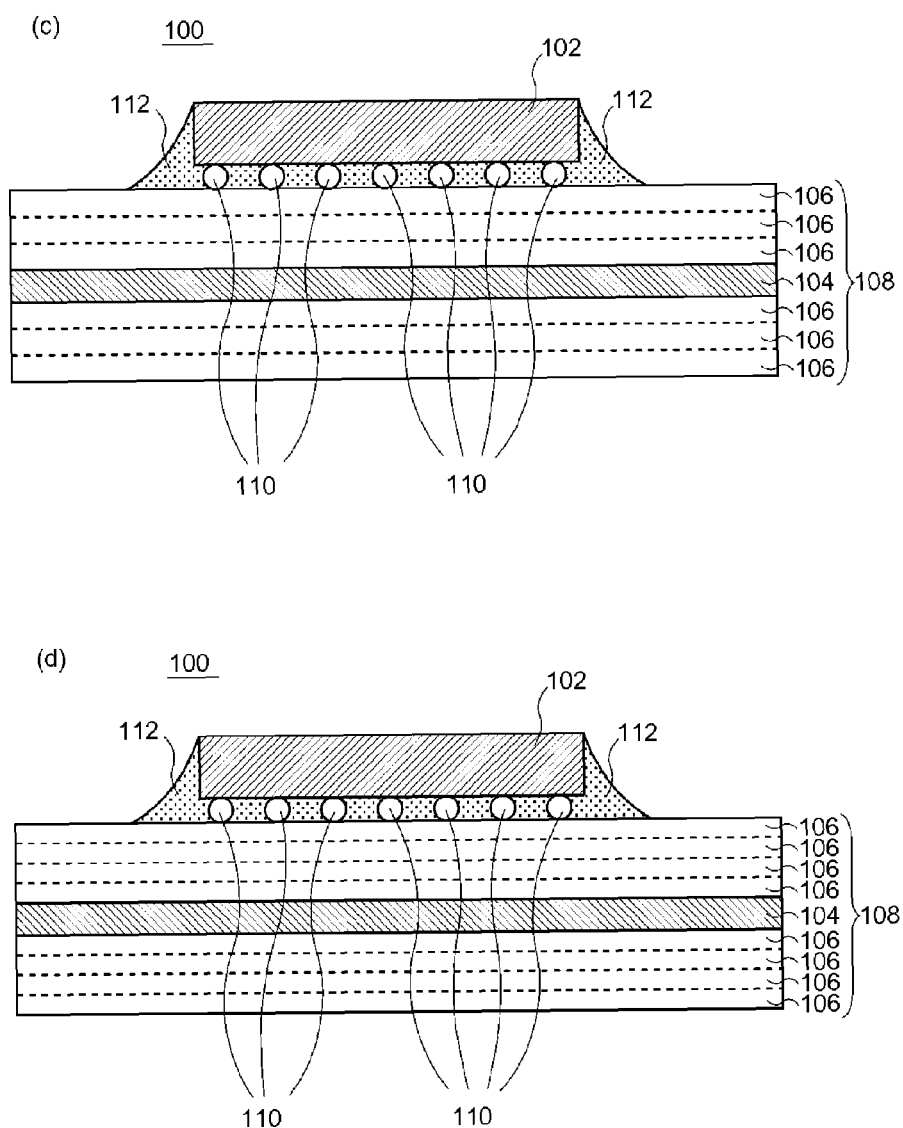

[Fig. 5]
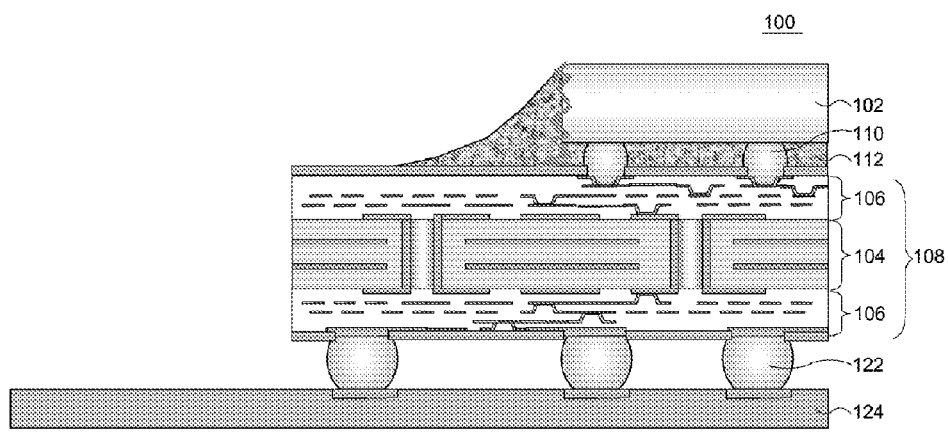
[Fig. 6]
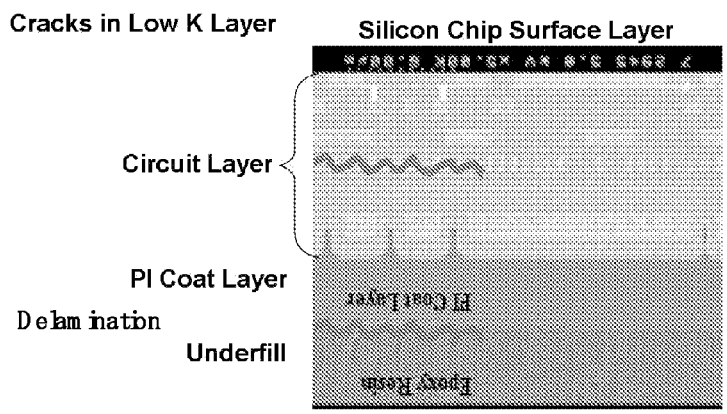
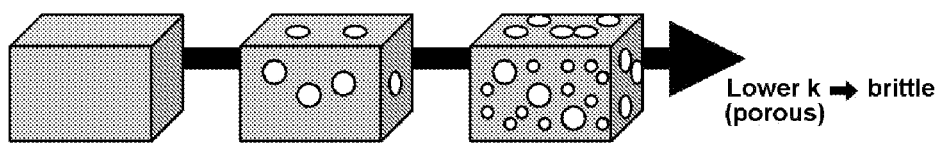

[Fig. 7]
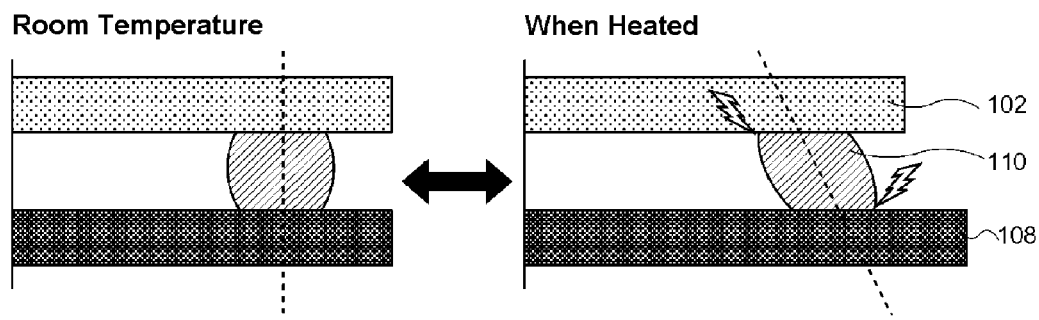
Solder Fatigue Damage in Temperature Shock Tests
(Lead-free ➡ brittle)

[Fig. 8]
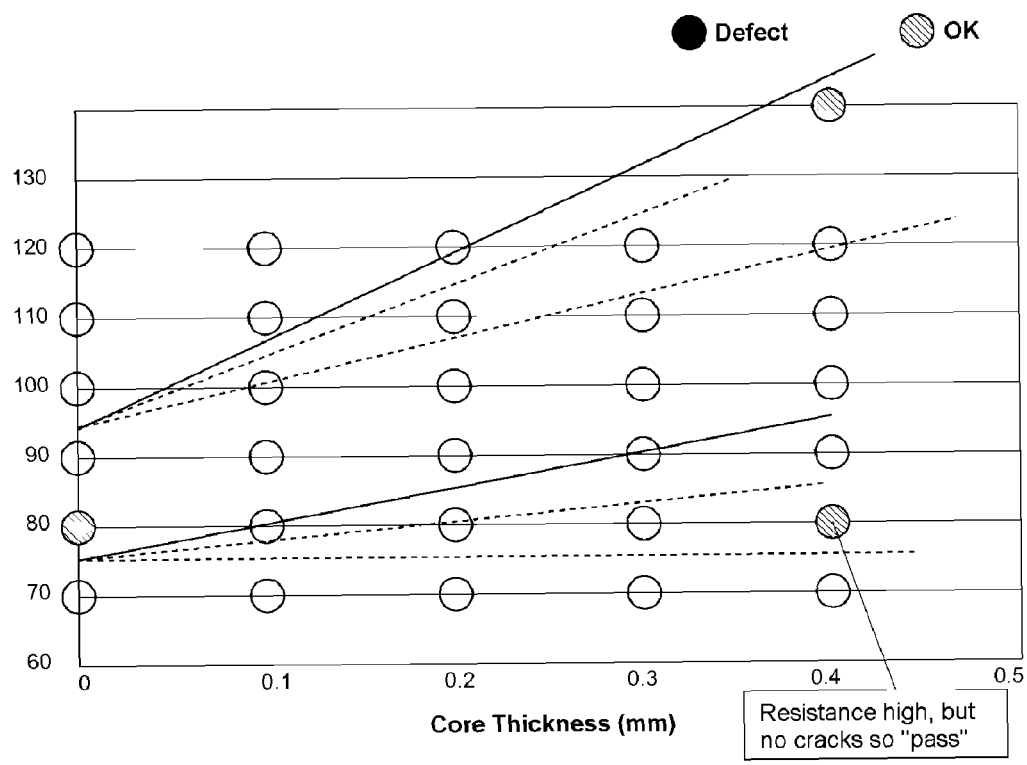

[Fig. 9]
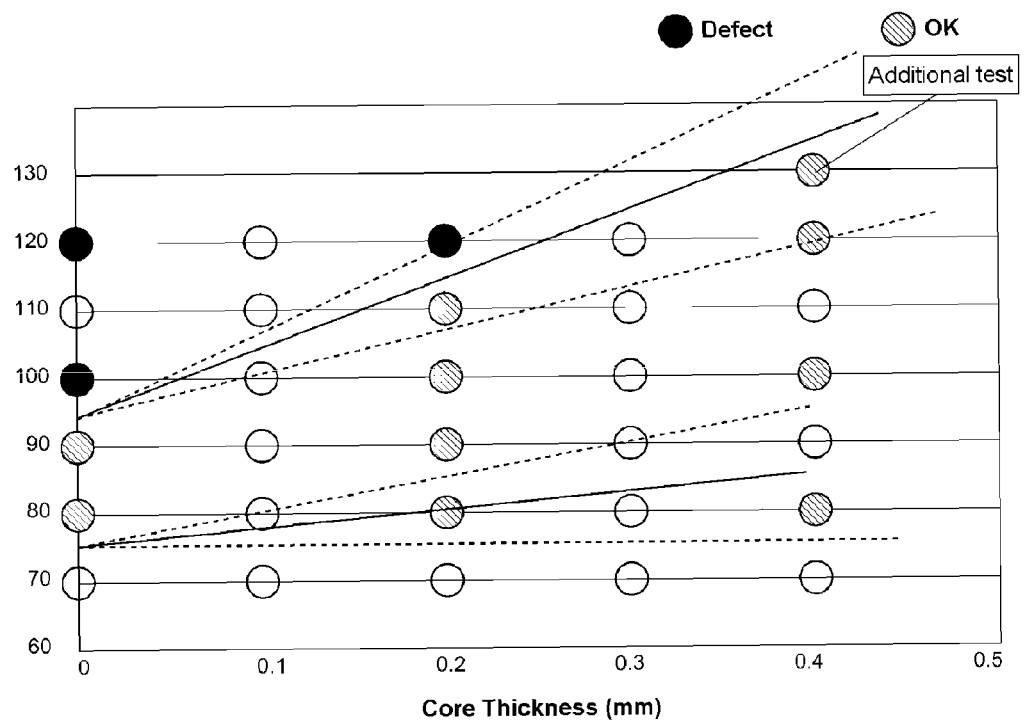

[Fig. 10]
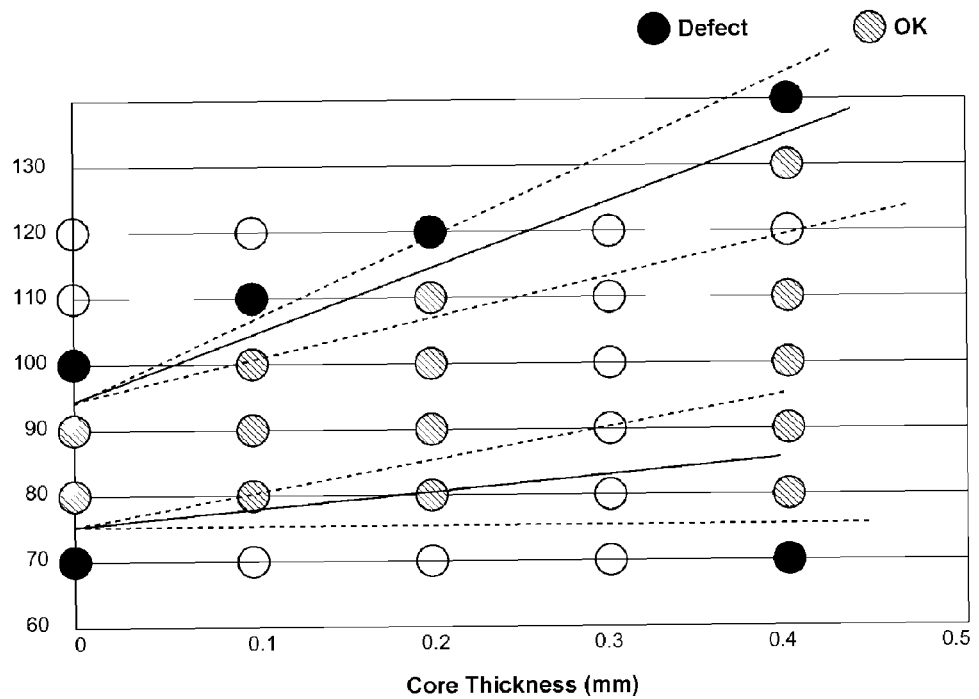

[Fig. 11]
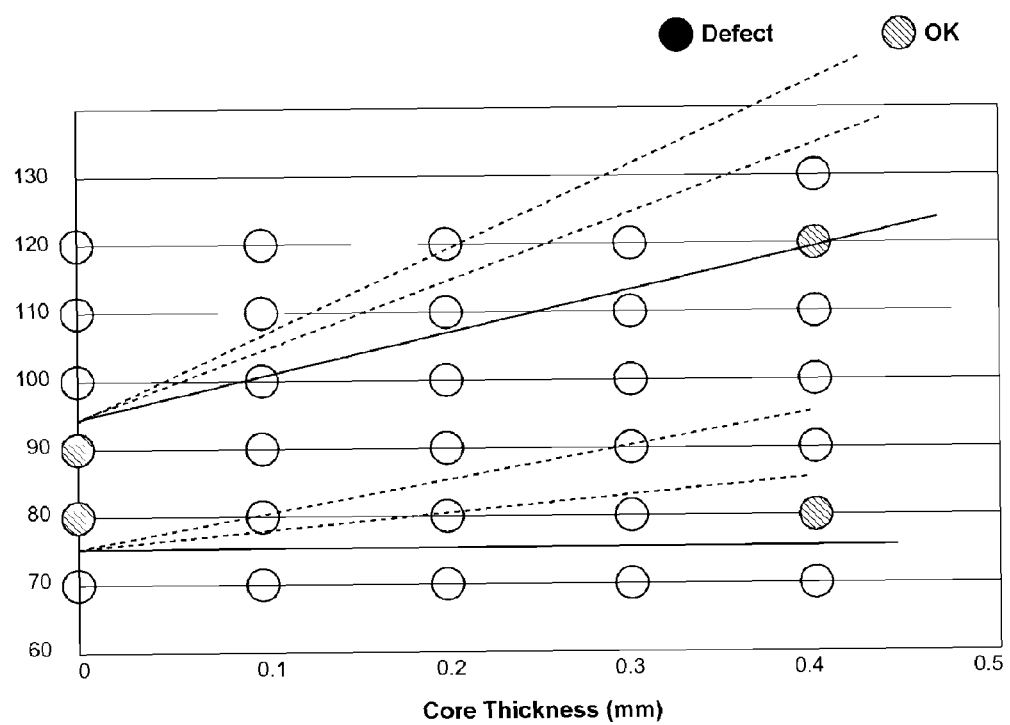

US 8,008,767 B2

SEMICONDUCTOR DEVICE

CROSS-REFERENCE TO RELATED APPLICATIONS

This application is the U.S. national stage of International Application No. PCT/JP2007/067283, filed Sep. 5, 2007, entitled "Semiconductor Device," which claims priority of Japanese Patent Application No. 2006-248473 filed Sep. 13, 2006, the disclosure of which is incorporated herein by reference in its entirety.

BACKGROUND

The present invention relates to a semiconductor device. In recent years, high-density mounting has become a useful elemental technology for achieving compactness, light weight and high performance in cellular telephones, digital video cameras and digital still cameras. In some cases, CSP (chip scale packages) consisting of single chips are inadequate to achieve high-density mounting, and packaging methods such as MCP (multi-chip packages) and SiP (System in Packages) have become more common.

The circuit boards, such as interposers and motherboards, used in composite semiconductor chip packages, such as MCP and SiP, require connections between semiconductor chips on a circuit board, so buildup substrates with high wiring density have come into use. Additionally, flip-chip mounting is becoming standard as a method for mounting semiconductor chips to circuit boards.

Here, flip-chip mounting refers to a method of mounting a semiconductor chip to a circuit board, wherein the semiconductor chip surface and circuit board are electrically connected, not by wire connections such as by wire bonding, but rather by projecting terminals known as "bumps" which are arranged in an array.

Flip-chip mounting is held to have the advantage of enabling the mounting area to be reduced as compared to wire bonding. Flip-chip mounting has the additional characteristic of having short wiring and therefore good electrical properties. Flip-chip mounting is suited to the circuits in portable devices, for which there is a strong demand for compactness and light weight, as well as to high frequency circuits in which the electrical properties are important.

The functions of the circuit boards to which the semiconductor chips are to be connected by flip-chip mounting are varied, including packaging substrates such as interposers and main substrates such as motherboards, as are the shapes and types which include both rigid substrates and flexible substrates. Flip-chip mounting is also used in "chip-on-chip" mounting methods for connecting semiconductor chips with each other. Flip-chip mounting is also known as flip-chip bonding, which is a term indicating a bonding method. Additionally, flip-chip mounting is also sometimes abbreviated as FC mounting or FC processing.

In semiconductor elements that are flip-chip mounted, the gap between the semiconductor element and the circuit board is usually filled with a reinforcing resin composition (underfill) to make the semiconductor element, circuit board and junction portion reliable. Such underfills need to be capable of filling into small gaps in a short period of time, be free of voids and filler segregation, have excellent adhesiveness to various materials, and achieve sufficient reliability for the semiconductor element, the circuit board and the junction portion. As materials for underfills, thermosetting resins typified by epoxy resins have been widely used. For example, JPH11-233571A discloses a semiconductor device using a thermosetting resin having specific properties as an underfill.

According to this publication, the semiconductor device is such that the active surface of a silicon chip is made to face a circuit board and electrically connected to the circuit board via a conductive material, and the gap between the silicon chip and the circuit board is filled and cured with a thermosetting resin composition. This thermosetting resin composition comprises a straight aliphatic hydrocarbon compound having at least 10 and at most 30 carbon atoms, capable of chemically binding to a thermosetting resin. According to the publication, this composition has high temperature cycling reliability while enabling the silicon chip to be removed at a low temperature with little shear, and without damaging the silicon chip or the circuit board.

Additionally, in the field of interposers, the reduced thickness of core materials, the use of coreless structures in which no core is provided, and layered bodies having wiring patterns formed on resins are used as interposers have enabled the development of thinner buildup type interposers having reduced overall interposer thickness and adapted to high frequencies by shortening the interlayer connection length to meet demands for support of higher density mounting and higher operating frequencies.

However, in these thin buildup type interposers, deformation of the interposers can easily occur due to changes in temperature conditions, and differences in the thermal expansion of the interposer, semiconductor chip and underfill can cause the stresses from ambient temperature changes to damage or destroy the solder bumps.

An example of a technology for the purpose of suppressing damage and destruction to solder bumps due to stresses from such ambient temperature changes in thin buildup type interposer with a coreless structure not having a core is the semiconductor device disclosed in JP 2006-24842A.

According to this publication, the semiconductor device comprises a semiconductor element and an interposer with a coefficient of thermal expansion of at least 16 ppm/° C. on which the semiconductor element is mounted, connected by solder bumps, wherein the gap between the semiconductor element and the interposer and the gaps between the solder bumps are filled with an underfill resin which is then cured. Additionally, the filler resin has a glass transition point at a temperature of 100-120° C., a modulus of elasticity at 125° C. of at least 0.1 GPa and a coefficient of thermal expansion a1 of at most 30 ppm/° C. at lower than the glass transition point. Furthermore, this publication describes that with this composition, it is possible to reduce damage and destruction between the semiconductor element, the interposer and the printed circuit board.

However, the conventional art described in the above publications have room for improvement in connection with the following points.

First, circuit boards and semiconductor chips usually have different coefficients of thermal expansion. Therefore, when a semiconductor device having a semiconductor chip mounted on a circuit board is subjected to a heat history, the difference in coefficient of thermal expansion can cause the circuit board to warp.

While the semiconductor device described in JP H11-233571A pertains to a thin buildup type interposer using a coreless structure that does not have a core, it does not consider thin buildup type interposers having a structure with a reduced core thickness. Generally, the coefficient of thermal expansion completely differs between coreless structures and structures having cores, so the degree of deformation of the interposer due to changes in temperature conditions will completely differ.

Secondly, in recent years, materials different from those that are conventional have come into use as the materials for forming semiconductor chips and materials for the bumps connecting the semiconductor chips to circuit boards, and underfills have also been newly designed in connection therewith. For example, with regard to semiconductor chips, low dielectric-constant films known as "low-k" have come into use as insulating film materials for forming wiring layers. By using such films, it is possible to suppress cross-talk between wires to result in semiconductor devices that operate at high speeds with high reliability. Additionally, materials not containing lead are becoming standard as the materials for bumps in consideration of friendliness to the environment.

The occurrence of damage such as cracks indicated above becomes more marked when low-k layers or lead-free solder are used. Low-k films generally do not have adequate mechanical strength. Therefore, when stresses occur in a semiconductor chip due to the package warpage or the like, cracks may appear in the low-k film even if the degree of stress is not very high. Additionally, since lead-free solders do not have adequate toughness, they can tend to form cracks in the interfaces between the bumps, the semiconductor chip and the circuit board.

SUMMARY OF THE INVENTION

The present invention was achieved in consideration of the above factors, and has the purpose of offering a technique of suppressing damage to semiconductor devices due to temperature changes when flip-chip mounting semiconductor elements onto buildup type circuit boards using structures with thinned cores, by appropriately designing the underfill in accordance with the properties of the circuit board.

The present invention offers a semiconductor device characterized by comprising a circuit board comprising a core and a buildup layer; a semiconductor element connected to the circuit board via metal bumps; and a encapsulating resin composition filling the gap between the semiconductor element and the circuit board; wherein the thickness of the core is at most 500 μm; the coefficient of thermal expansion in the planar direction of the core from room temperature to the glass transition temperature is at most 15 ppm/° C.; the coefficient of thermal expansion in the thickness direction of the core from room temperature to the glass transition temperature is at most 18 ppm/° C.; the coefficient of thermal expansion of the encapsulating resin composition from room temperature to the glass transition temperature is at least 15 ppm/° C. and at most 30 ppm/° C.; and the glass transition temperature Tg (° C.) by TMA analysis of the encapsulating resin composition satisfies the equation 75≦Tg<112.5T+95, where T (mm) is the thickness of the core.

According to this structure, when flip-chip mounting a semiconductor element onto a buildup type circuit board using a structure with a thinned core, a core having a small coefficient of thermal expansion is used on the circuit board, and the coefficient of thermal expansion and glass transition point of the underfill are appropriately designed in accordance with the thickness and coefficient of linear expansion of the core, thereby relieving stresses in the semiconductor device caused by deformation of the circuit board due to temperature changes, and thus suppressing damage to the semiconductor device due to temperature changes.

Additionally, the present invention offers a semiconductor device comprising a circuit board comprising a core and a buildup layer; a semiconductor element connected to the circuit board via metal bumps; and an encapsulating resin composition filling the gap between the semiconductor element and the circuit board; wherein the circuit board comprises at most three buildup layers; the thickness of the core is at most 500 μm; the coefficient of thermal expansion in the planar direction of the core from room temperature to the glass transition temperature is at most 15 ppm/° C.; the coefficient of thermal expansion in the thickness direction of the core from room temperature to the glass transition temperature is at most 18 ppm/° C.; the coefficient of thermal expansion of the encapsulating resin composition from room temperature to the glass transition temperature is at least 15 ppm/° C. and at most 30 ppm/° C.; and the glass transition temperature Tg (° C.) by TMA analysis of the encapsulating resin composition satisfies the equation 50T+75≦Tg<125T+95, where T (mm) is the thickness of the core.

According to this structure, when flip-chip mounting a semiconductor element on a buildup type circuit board using a structure with a thinned core, a core with a small coefficient of thermal expansion is used for the circuit board, and the coefficient of thermal expansion and glass transition point of the underfill are appropriately designed in accordance with the thickness and coefficient of thermal expansion of the core in view of the characteristic conditions when there are three or less buildup layers, thereby relieving stresses in the semiconductor device caused by deformation of the circuit board due to temperature changes, and thus suppressing damage to the semiconductor device due to temperature changes.

Additionally, the present invention offers a semiconductor device comprising a circuit board comprising a core and a buildup layer; a semiconductor element connected to the circuit board via metal bumps; and an encapsulating resin composition filling the gap between the semiconductor element and the circuit board; wherein the thickness of the core is at most 500 μm; the core is formed by impregnating a fiber substrate with a resin composition comprising a cyanate resin, a phenol resin, an epoxy resin and an inorganic filler, and curing; the coefficient of thermal expansion of the encapsulating resin composition from room temperature to the glass transition temperature is at least 15 ppm/° C. and at most 30 ppm/° C.; and the glass transition temperature Tg (° C.) by TMA analysis of the encapsulating resin composition satisfies the equation 75≦Tg<112.5T+95, where T (mm) is the thickness of the core.

According to this structure, when flip-chip mounting a semiconductor element on a buildup type circuit board using a structure with a thinned core, a core of a characteristic composition is used for the circuit board, and the coefficient of thermal expansion and glass transition point of the underfill are appropriately designed in accordance with the thickness and composition of the core, thereby relieving stresses in the semiconductor device caused by deformation of the circuit board due to temperature changes, and thus suppressing damage to the semiconductor device due to temperature changes.

Additionally, the present invention offers a semiconductor device comprising a circuit board comprising a core and a buildup layer; a semiconductor element connected to the circuit board via metal bumps; and a encapsulating resin composition filling the gap between the semiconductor element and the circuit board; wherein the circuit board comprises at most three buildup layers; the thickness of the core is at most 500 μm; the core is formed by impregnating a fiber substrate with a resin composition comprising a cyanate resin, a phenol resin, an epoxy resin and an inorganic filler, and curing; the coefficient of thermal expansion of the encapsulating resin composition from room temperature to the glass transition temperature is at least 15 ppm/° C. and at most 30 ppm/° C.; and the glass transition temperature Tg (° C.) by TMA analysis of the encapsulating resin composition satisfies the equation 50T+75≦Tg<125T+95, where T (mm) is the thickness of the core.

According to this structure, when flip-chip mounting a semiconductor element on a buildup type circuit board using a structure with a thinned core, a core of a characteristic composition is used for the circuit board, and the coefficient of thermal expansion and glass transition point of the underfill are appropriately designed in accordance with the thickness and composition of the core in view of the characteristic conditions when there are three or less buildup layers, thereby relieving stresses in the semiconductor device caused by deformation of the circuit board due to temperature changes, and thus suppressing damage to the semiconductor device due to temperature changes.

According to the present invention, when flip-chip mounting a semiconductor element onto a buildup type circuit board using a structure with a thinned core, the underfill is appropriately designed in accordance with the properties of the circuit board, thus suppressing damage to the semiconductor device due to temperature changes.

BRIEF DESCRIPTION OF THE DRAWINGS

A better understanding of the present invention will be had with reference to the following drawings in which:

FIG. 1 is a photograph for explaining the structure of a semiconductor device according to an embodiment.

FIGS. 2a to 2(c) are section views for explaining the development of thinning technologies in interposers.

FIG. 3 is a conceptual diagram for explaining the design of a buildup type interposer.

FIGS. 4(a) to 4(d) are section views for explaining the structure of a semiconductor device according to an embodiment.

FIG. 5 is a section view for explaining an example of failure in a thin FC-BGA type semiconductor device.

FIG. 6 is a section photograph for explaining the conditions under which cracks occur in a thin FC-BGA type semiconductor device.

FIG. 7 is a conceptual diagram for explaining the mechanism whereby cracks occur in the solder bumps in a thin FC-BGA type semiconductor device.

FIG. 8 is a graph for explaining the results of thermal cycling tests in a thin FC-BGA type semiconductor device using a 1-2-1 type interposer.

FIG. 9 is a graph for explaining the results of thermal cycling tests in a thin FC-BGA type semiconductor device using a 2-2-2 type interposer.

FIG. 10 is a graph for explaining the results of thermal cycling tests in a thin FC-BGA type semiconductor device using a 3-2-3 type interposer.

FIG. 11 is a graph for explaining the results of thermal cycling tests in a thin FC-BGA type semiconductor device using a 4-2-4 type interposer.

DETAILED DESCRIPTION

List of Reference Numerals
  100 semiconductor package
  102 silicon chip
  104 core
  106 buildup layer
  108 multilayer substrate
  110 solder bump
  112 underfill
  120 motherboard
  122 secondary ball
  1000 electronic device Herebelow, modes for carrying out the invention shall be explained with reference to the drawings. In all of the drawings, the same constituents shall be indicated by the same reference numbers, and their explanations will be omitted where appropriate.

Embodiment 1

Semiconductor Package Using 1-2-1-Type Multilayer Substrate

In a 1-2-1 type multilayer substrate, a wiring layer is provided on both surfaces of a core, and a buildup layer having a wiring layer is further formed on both surfaces thereof. That is, beginning from the bottom, there is one wiring layer on the surface of a buildup layer, two layers on the core, and one layer on the surface of a buildup layer, which is the reason it is known as a 1-2-1 type multilayer substrate.

SUMMARY OF PRESENT EMBODIMENT

In the present embodiment, flip-chip mounting is employed as the method for mounting semiconductor elements to a circuit board such as an interposer. FIG. 1 is a photograph for explaining the constitution of an electronic device 1000 including a semiconductor package 100 according to the embodiment. In this semiconductor package 100, a silicon chip 102 which is a semiconductor element is connected to a multilayer substrate (laminate) 108, which is a circuit board, by flip-chip mounting. Additionally, the area between the silicon chip 102 and the multilayer substrate 108 is filled with an underfill 112 which is an encapsulating resin composition. The semiconductor package 100 including these elements is connected to the motherboard 120 to form the overall electronic device 1000.

Since flip-chip mounting is used to mount the silicon chip 102 onto the multilayer substrate 108 in the semiconductor package 100, the surface of the silicon chip 102 and the multilayer substrate 108 are electrically connected not by using wires such as in wire bonding, but rather by means of solder bumps (not shown) which are projecting terminals that are arranged in an array. Additionally, the semiconductor package 100 is itself connected to a motherboard 120 via solder bumps (not shown).

Flip-chip mounting has the advantage of enabling high-density mounting due to fact that the mounting area can be reduced in comparison to wire bonding. Additionally, flip-chip mounting also has the advantage of having good electrical properties due to the shortness of the wiring. Therefore, since the semiconductor package 100 contained in the electronic device 1000 of the present embodiment has a silicon chip 102 flip-chip mounted on a multilayer substrate 108, it is suited to the circuits in portable devices for which there is a strong demand for compactness and light weight, and to high frequency circuits in which electrical properties are important.

FIG. 2 is a section view for explaining the development of thinning technologies in interposers. Conventionally, the cores of multilayer substrates such as interposers have had a thickness of about 0.8 mm as shown in FIG. 2(a). Recent years have seen increased thinning of multilayer substrates (thinning of cores and buildup layers) as shown in FIGS. 2(b) and 2(c) due to advantages such as reductions in substrate cost (materials costs and processing costs) of multilayer substrates and improvements in electrical properties.

However, thinning of multilayer substrates increases the seriousness of various issues that have conventionally presented a problem in multilayer substrates. That is, thinning of multilayer substrates (thinning of cores and buildup layers) causes increased warpage of semiconductor packages overall. As a result, the stress on semiconductor chips having low-k layers, which tend to be mechanically weak, can increase and make semiconductor chips more susceptible to damage. Additionally, the increased warpage of the semiconductor package overall can affect secondary mounting of the semiconductor package to motherboards and the like. 111

Furthermore, the increased warpage of the semiconductor package overall tends to reduce the protection of lead-free bumps which tend to be mechanically brittle but whose use is recently on the rise due to environmental regulations, and to cause damage to portions of the connection between the semiconductor packages and multilayer substrate.

Thus, the recent demand for thinner semiconductor packages has led to the use of materials different from those that have been conventionally used for forming semiconductor chips and bumps for connecting semiconductor chips and circuit boards, which in turn has led to a need for newly designed underfills to cope with these developments.

FIG. 3. is a conceptual diagram for explaining the design of a buildup type interposer. While this drawing concerns the design of a 3-2-3 type buildup type interposer, the explanation applies to design of buildup type interposers of 1-2-1 type, 2-2-2 type and 4-2-4 type as well.

Buildup type multilayer substrates 108 such as the thin buildup type interposer of the present embodiment are prepared by laminating both surfaces of a core 104 with circuit wiring 114 consisting of copper foil or the like, further laminating with buildup layers 106, and further laminating with circuit wiring 114. The lamination of buildup layers 106 and circuit wiring 114 is repeated three times on each surface in the case of a 3-2-3 type structure. In this way, a 3-2-3 type buildup type interposer is obtained.

In this case, the degree of deformation due to temperature changes and the coefficient of thermal expansion of the multilayer substrate 108 will be largely affected by the thickness and coefficient of thermal expansion of the core 104. Additionally, the degree of deformation due to temperature changes and the coefficient of thermal expansion of the multilayer substrate 108 will be affected not only by the coefficient of thermal expansion of the core 104, but also that of the buildup layer 106. In addition to these factors, the degree of deformation due to temperature changes and the coefficient of thermal expansion of the multilayer substrate 108 will also be affected somewhat by other factors such as the laminar structure of the multilayer substrate 108, the thickness of the buildup layer 106, and the thickness of the circuit wiring 114 consisting of copper foil or the like.

However, since the degree of deformation due to temperature changes and the coefficient of thermal expansion of the multilayer substrate 108 is particularly affected, among these factors, by the thickness and coefficient of thermal expansion of the core 104, the degree of deformation due to temperature changes and the coefficient of thermal expansion of the multilayer substrate 108 can be determined with considerable precision by prescribing the thickness and coefficient of thermal expansion of the core 104.

Herebelow, the constitution of the present embodiment will be explained in detail.

FIG. 4($a$) is a section view for explaining the constitution of a semiconductor package 100 according to an embodiment. The semiconductor package 100 explained in detail below uses a thin multilayer substrate (thin core and buildup layers) 108 with a thickness of at most 500 μm to satisfy the demand for high-density mounting described above.

However, in the present embodiment, as explained below, the coefficient of thermal expansion and glass transition point of the underfill 112 are designed appropriately based on the thickness and coefficient of thermal expansion of the core 104 of the thin multilayer substrate 108 so as to solve the various problems that are aggravated by the thinning of the multilayer substrate 108. Thus, as demonstrated by the experimental data provided below, reductions in reliability due to changes in temperature conditions can be suitably suppressed.

This semiconductor package 100 comprises a multilayer substrate 108 having a core 104 and buildup layers 106, and a silicon chip 102 connected to the multilayer substrate 108 via solder bumps 110. Additionally, the gap between the silicon chip 102 and the multilayer substrate 108 is filled with an underfill 112. The buildup layers 106 contained in the multilayer substrate 108 comprise one layer on each side of the core 104.

The semiconductor package 100 can be considered to be a type of semiconductor device. In addition to the core 104 and the buildup layers 106, the multilayer substrate 108 has circuits consisting of copper foil on both surfaces of the core 104 and the buildup layer 106, and can therefore be considered to be a type of circuit board. Furthermore, the silicon chip 102 is an element having the semiconductor silicon as a base material and can be considered to be a type of semiconductor element.

Furthermore, the solder bumps 110 are bumps consisting of metals not containing lead, and can be considered to be a type of metal bump. Additionally, the underfill 112 is a resin composition for encapsulating the gap between the silicon chip 102 and the multilayer substrate 108, and can be considered to be a type of encapsulating resin composition.

In this multilayer substrate 108, the thickness of the core 104 is at most 500 μm, preferably at most 400 μm and more preferably at most 200 μm. By holding the thickness of the core to no more than these values, it is possible to reduce the cost of production (material costs and processing costs) of the multilayer substrate 108 and improve the electrical properties. Furthermore, it is possible to suppress the generation of signal delays, crosstalk noise and variations in the potential of the power supply line. While there are not particular lower limits on the thickness of the core 104, it should preferably be at least 20 μm in view of production and strength considerations.

Additionally, in this multilayer substrate 108, the coefficient of thermal expansion in the planar direction (by TMA analysis, in the X direction and the Y direction) of the core 104 from room temperature to the glass transition temperature is at most 15 ppm/° C. and preferably at most 13 ppm/° C. If the coefficient of thermal expansion in the planar direction of the core 104 is held to at most these values, then it is possible to suppress expansion and contraction in the planar direction of the core 104 due to changes in temperature conditions, thus likewise suppressing expansion and contraction in the planar direction of the multilayer substrate 108. While there are no particular lower limits on the coefficient of thermal expansion in the planar direction of the core 104, it should preferably be at least 10 ppm/° C. for production purposes.

Furthermore, in this multilayer substrate 108, the coefficient of thermal expansion in the thickness direction (by TMA, in the Z direction, a1) of the core 104 from room temperature to the glass transition temperature is at most 18 ppm/° C. and preferably at most 16 ppm/° C. If the coefficient of thermal expansion in the thickness direction of the core 104 is held to at most these values, then it is possible to suppress expansion and contraction in the thickness direction of the core 104 due to changes in temperature conditions, thus likewise suppressing expansion and contraction in the thickness direction of the multilayer substrate 108. While there are no particular lower limits on the coefficient of thermal expansion in the thickness direction of the core 104, it should preferably be at least 10 ppm/° C. for production purposes.

The method of measuring the coefficient of thermal expansion (CTE) of the core is as follows.

A 0.1 mm thick plate laminated with copper on both sides is etched over its entire surface, and 4 mm×20 mm test pieces are cut out from the laminated plate in both the longitudinal and lateral directions, and a TMA analyzer (TA Instruments) is used to measure the coefficient of thermal expansion in the longitudinal and lateral directions at 5° C./min (compression mode in the longitudinal direction and tension mode in the lateral direction).

Additionally, in this multilayer substrate 108, the core 104 is formed by impregnating a fiber matrix with a resin composition comprising a cyanate resin, a phenol resin, an epoxy resin and an inorganic filler, and curing. A core with such a composition is capable of satisfying the above-mentioned conditions for the coefficient of thermal expansion while maintaining various properties necessary for the core 104 such as the strength. By optimizing the added amounts in the combination of cyanate resin and filler (inorganic filler) or the combination of epoxy resin and filler, it is possible to easily adjust the above-mentioned coefficient of thermal expansion (CTE) within an appropriate design range. The combination of a novolac cyanate resin and a filler is especially preferred.

In this multilayer substrate 108, the thickness for each layer in the buildup layers 106 is at most 60 μm, preferably at most 40 μm. Additionally, the thickness of the buildup layer 106 is at least 10 μm and preferably at least 20 μm. As long as the thickness for each layer in the buildup layers 106 is within these ranges, the Tg function of the underfill 112 to be explained below is favorably established. Additionally, if the thickness per layer of the buildup layers 106 is within these ranges, the production cost (material cost and processing cost) of the buildup layers 106 can be reduced while maintaining the strength and production stability of the buildup layers 106, and further improving the electrical properties.

In this multilayer substrate 108, the thickness for each layer in the wiring layers (not shown) provided on both surfaces of the core 104 and the surfaces of the buildup layers 106 is at most 35 μm, preferably at most 20 μm. Moreover, the thickness for each layer in the wiring layers is at least 3 μm, preferably at least 10 μm. As long as the thickness for each layer in the wiring layers is within these ranges, the Tg function of the underfill 112 to be explained below is favorably established. Additionally, as long as the thickness for each layer in the wiring layers is within these ranges, it is possible to reduce the production cost (material cost and processing cost) of the wiring layer while maintaining the electrical conductivity and production stability of the wiring layers.

Additionally, in this multilayer substrate 108, the coefficient of thermal expansion in the planar direction from room temperature to the glass transition temperature of the buildup layers 106 is at most 35 ppm/° C., preferably at most 30 ppm/° C., and more preferably at most 18 ppm/° C. As long as the coefficient of thermal expansion of the buildup layers 106 is at most these values, then deformations of the buildup layers 106 can be suppressed by changing the temperature conditions, thus enabling deformations of the multilayer substrate 108 to be likewise suppressed. Additionally, while there is no particular lower limit on the coefficient of thermal expansion of the buildup layer 106, it is preferably at least 10 ppm/° C. in view of production.

The method of measuring the coefficient of thermal expansion (CTE) of the buildup layers is as follows.

Two insulation sheets with copper foil are pressed together with their resin surfaces inside, subjected to one hour of thermal compression molding at a pressure of 2 MPa and a temperature of 220° C. in a vacuum press, and the entire surface of the copper foil is etched away to obtain a cured insulating resin. 4 mm×20 mm tests pieces were cut out from the resulting cured insulating resin, and their coefficient of thermal expansion was measured at 10° C./minute by a TMA analyzer (TA Instruments). Since the CTE of the buildup layers is the same in the planar direction and the thickness direction, it is sufficient to perform only tension mode measurements in the planar direction.

Additionally, in this multilayer substrate 108, the buildup layers 106 are formed by curing a resin composition comprising a cyanate resin, a phenol resin, an epoxy resin and an inorganic filler. Buildup layers 106 of this composition are capable of satisfying the above-described conditions for the coefficient of thermal expansion while maintaining various properties necessary for the buildup layers 106 such as insulating ability. By optimizing the added amounts in the combinations of cyanate resin and filler (inorganic filler) or combinations of epoxy resin and filler, it is possible to easily adjust the coefficient of thermal expansion (CTE) to within an appropriate design range. The combination of a novolac cyanate resin and a filler is especially preferred.

Additionally, the coefficient of thermal expansion (by TMA analysis) from room temperature to the glass transition temperature of the underfill 112 is at least 15 ppm/° C. and preferably at least 17 ppm/° C. Additionally, the coefficient of thermal expansion (by TMA analysis) from room temperature to the glass transition temperature of the underfill 112 is less than 30 ppm/° C. and preferably at most 28 ppm/° C. As long as the coefficient of thermal expansion of the underfill 112 is within these ranges, it is possible to reduce stresses inside the semiconductor package 100 caused by deformation of the multilayer substrate 108 due to temperature changes, thus suppressing damage to the semiconductor package 100 due to temperature changes.

The method for measuring the Tg of the underfill is as follows.

First, the resin composition is cured at 150° C.×120 min, then a test piece of 5×5×10 mm is obtained by cutting. This test piece is measured under conditions of a compression load of 5 g and a temperature range of −100° C. to 300° C. at a temperature increase rate of 10° C./min, using a Seiko TMA/SS 120. In this way, it is possible to calculate both CTE and Tg using a TMA analyzer.

Additionally, the glass transition temperature Tg (° C.) of the underfill 112 obtained by TMA analysis satisfies the equation $75 \leq Tg$, preferably $25T+75 \leq Tg$, more preferably $50T+75 \leq Tg$, where T (mm) is the thickness of the core 104. Additionally, the glass transition temperature Tg (° C.) of the underfill 112 obtained by TMA analysis satisfies the equation $Tg<112.5T+95$, preferably $\leq 100T+95$, and more preferably $75T+95$. As long as the glass transition temperature Tg of the underfill 112 is within these ranges, it is possible to reduce the stresses inside the semiconductor package 100 caused by deformation of the multilayer substrate 108 due to temperature changes, thus suppressing damage to the semiconductor package 100 due to temperature changes. These numerical restrictions of the glass transition temperature Tg (° C.) are basically established without any relationship to the layer structure of the multilayer substrate 108, and are preferably established when the thickness per layer of the buildup layers 106 of the multilayer substrate 108 is 20-60 μm, and the thickness per layer of the copper foil (not shown) is within the range of 3-20 μm.

In Embodiment 1, the multilayer substrate 108 has three or less buildup layers 106, so the glass transition temperature Tg (° C.) of the underfill 112 by TMA analysis preferably satisfies the equation $50T+75 \leq Tg < 125T+95$, where T (mm) is the thickness of the core 104. As will be clear from experimental data to be described below, when there are three or less buildup layers 106, damage to the semiconductor package 100 due to temperature changes can be particularly well suppressed as long as the glass transition temperature Tg of the underfill 112 is within this range. The numerical restrictions on the glass transition temperature Tg (° C.) are established based on the layer structure of the multilayer substrate (108), and are preferably established when there are three or less buildup layers 106 in the multilayer substrate 108.

The basis for the derivation of the relationship for the glass transition temperature Tg (° C.) of the underfill by TMA analysis shall be explained below.

The present inventors changed the layer structure, thickness and physical properties of the substrate in an FC-BGA-type semiconductor device and determined the optimal underfill properties thereof by means of stress calculations (simulations), whereupon they discovered that the reliability in thermal shock tests was markedly improved over that of conventional thin FC-BGA-type semiconductor devices when the glass transition temperature Tg (° C.) of the underfill 112 by TMA analysis satisfies certain relationships in semiconductor packages 100 indicated by the present Embodiment 1 as well as Embodiments 2-4 to be described below.

The stress calculations were performed by preparing models of FC-BGA devices using parameters such as the structure (dimensions), CTE, Tg and modulus of elasticity of silicon chips, metal bumps and multilayer substrates (including core buildup layers, copper wiring and the like) forming semiconductor devices, and the parameters such as Tg, CTE and modulus of elasticity of the underfill encapsulating the device were changed using statistical techniques to calculate the deformation, stress and stress relief values of various portions of the semiconductor device, thereby determining the properties of the underfill whereby the destruction and deformation were within allowable limits.

As prerequisites to the stress calculations, they were performed so as to satisfy the following factors:

i) assuming a low-k film on the circuitry surface of the silicon chip 102, the stress was such as not to cause interlayer delamination of the low-k materials;

ii) the predicted lifetime of the solder bumps (assuming SnAgCu) 100 was at least 1000 cycles of a thermal shock test (−55° C. for 30 minutes, 125° C. for 30 minutes);

iii) the silicon chips 102 were not destroyed by warping deformation of the semiconductor device; and iv) the delamination stress of the interface between the side surface of the silicon chip 102 and the underfill 112 is less than or equal to the adhesion strength of the underfill.

The properties of underfills satisfying these factors were determined, and upon summarizing them, the above-described relationships for Tg were obtained.

Here, only a summary of the present embodiment, its structure and the derivation of the relationship for the Tg of the underfill shall be provided; the compositions of the materials used in the present embodiment and the functions and effects of the present embodiment shall be described below. This shall apply also to Embodiments 2-4 described below.

Embodiment 2

Semiconductor Package Using 2-2-2-Type Multilayer Substrate

In a 2-2-2 type multilayer substrate, wiring layers are provided on both surfaces of a core, and two buildup layers having wiring layers are provided on both sides thereof. That is, viewed from below, there is a wiring layer on the surface of each of two buildup layers for a total of two layers, two layers on either side of the core, and a layer on the surface of each of two buildup layers for a total of two layers, thus resulting in a 2-2-2 type multilayer substrate.

FIG. 4(b) is a section view for explaining the structure of a semiconductor package 100 according to an embodiment. This Embodiment 2 has basically the same structure as Embodiment 1, but the number of buildup layers 106 contained in the multilayer substrate 108 differs in that there are two layers on either side of the core 104.

As in the case of Embodiment 1, as long as the coefficient of thermal expansion (by TMA analysis) from room temperature to the glass transition temperature of the underfill 112 and the glass transition temperature Tg (° C.) by TMA analysis satisfies the function explained in the above Embodiment 1, it is possible to reduce the stresses inside the semiconductor package 100 caused by deformation of the multilayer substrate 108 due to temperature changes, and thereby suppress damage to the semiconductor package 100 due to temperature changes.

In the case of Embodiment 2, the multilayer substrate 108 has at least four and at most six buildup layers 106, so the glass transition temperature Tg (° C.) of the underfill 112 by TMA analysis preferably satisfies the equation $25T+75 \leq Tg \leq 100T+95$, where T (mm) is the thickness of the core 104. This is because when there are at least four and at most six buildup layers 106, as can be understood from the experimental data to be described below, it is possible to markedly suppress damage to the semiconductor package 100 due to temperature changes as long as the glass transition temperature Tg of the underfill 112 is within this range.

Embodiment 3

Semiconductor Package Using 3-2-3-Type Multilayer Substrate

In a 3-2-3 type multilayer substrate, wiring layers are provided on both surfaces of a core, and three buildup layers having wiring layers are provided on both sides thereof. That is, viewed from below, there is a wiring layer on the surface of each of three buildup layers for a total of three layers, two layers on either side of the core, and a layer on the surface of each of three buildup layers for a total of three layers, thus resulting in a 3-2-3 type multilayer substrate.

FIG. 4(c) is a section view for explaining the structure of a semiconductor package 100 according to an embodiment. This Embodiment 3 has basically the same structure as Embodiment 1, but the number of buildup layers 106 contained in the multilayer substrate 108 differs in that there are three layers on either side of the core 104.

As in the case of Embodiment 1, as long as the coefficient of thermal expansion (by TMA analysis) from room temperature to the glass transition temperature of the underfill 112 and the glass transition temperature Tg (° C.) by TMA analysis satisfies the function explained in the above Embodiment 1, it is possible to reduce the stresses inside the semiconductor package 100 caused by deformation of the multilayer substrate 108 due to temperature changes, and thereby suppress damage to the semiconductor package 100 due to temperature changes.

In the case of Embodiment 3, the multilayer substrate 108 has at least four and at most six buildup layers 106, so the glass transition temperature Tg (° C.) of the underfill 112 by TMA analysis preferably satisfies the equation 25T+75≦Tg≦100T+95, where T (mm) is the thickness of the core 104. This is because when there are at least four and at most six buildup layers 106, as can be understood from the experimental data to be described below, it is possible to markedly suppress damage to the semiconductor package 100 due to temperature changes as long as the glass transition temperature Tg of the underfill 112 is within this range.

Embodiment 4

Semiconductor Package Using 4-2-4-Type Multilayer Substrate

In a 4-2-4 type multilayer substrate, wiring layers are provided on both surfaces of a core, and three buildup layers having wiring layers are provided on both sides thereof. That is, viewed from below, there is a wiring layer on the surface of each of three buildup layers for a total of four layers, two layers on either side of the core, and a layer on the surface of each of four buildup layers for a total of four layers, thus resulting in a 4-2-4 type multilayer substrate.

FIG. 4(d) is a section view for explaining the structure of a semiconductor package 100 according to an embodiment. This Embodiment 4 has basically the same structure as Embodiment 1, but the number of buildup layers 106 contained in the multilayer substrate 108 differs in that there are four layers on either side of the core 104.

As in the case of Embodiment 1, as long as the coefficient of thermal expansion (by TMA analysis) from room temperature to the glass transition temperature of the underfill 112 and the glass transition temperature Tg (° C.) by TMA analysis satisfies the function explained in the above Embodiment 1, it is possible to reduce the stresses inside the semiconductor package 100 caused by deformation of the multilayer substrate 108 due to temperature changes, and thereby suppress damage to the semiconductor package 100 due to temperature changes.

In the case of Embodiment 4, the multilayer substrate 108 has at least seven buildup layers 106, so the glass transition temperature Tg (° C.) of the underfill 112 by TMA analysis preferably satisfies the equation 75≦Tg≦75T+95, where T (mm) is the thickness of the core 104. This is because when there are at least seven buildup layers 106, as can be understood from the experimental data to be described below, it is possible to markedly suppress damage to the semiconductor package 100 due to temperature changes as long as the glass transition temperature Tg of the underfill 112 is within this range.

Herebelow, the functions and effects of the semiconductor device of Embodiments 1-4 shall be explained.

In order to enable the functions and effects of the semiconductor device of Embodiments 1-4 to be easily understood, the section view for explaining an example of failure in a conventional thin FC-BGA-type semiconductor device shown in FIG. 5 shall be explained with reference to the issues connected with conventional FC-BGA devices.

Normally, in conventional semiconductor packages 100 as shown in FIG. 5, the coefficient of thermal expansion differs between the multilayer substrate 108 and the silicon chip 102. That is, the multilayer substrate 108 is composed of a material comprising an organic resin, and has a high coefficient of expansion than the silicon chip 102. Furthermore, when a semiconductor package 100 with a structure having a silicon chip 102 mounted on a multilayer substrate 108 is subjected to a heat history, differences in the coefficient of thermal expansion cause the multilayer substrate 108 to become warped as shown in FIG. 5.

As a result, as shown in FIG. 5, in conventional semiconductor packages 100, there are cases in which the silicon chip 102 can become cracked, or electrical connections between the multilayer substrate 108 and the mother board 122 via the secondary balls 122 can fail. Furthermore, there are cases in which the fillets formed by the underfill 112 on the side surfaces of the silicon chip 102 can separate or cracks can occur in the fillet.

Furthermore, in recent years, materials different from those that are conventionally used have come into use as the materials of silicon chips 102 and the materials of solder bumps 110 connecting the silicon chips 102 and the multilayer substrate 108, and there has been a demand for underfill materials 112 newly designed to be compatible therewith.

For example, in silicon chips 102, films with low dielectric constants, known as "low-k", are coming into use as the material for insulation films forming the wiring layer. By using such films, it is possible to suppress cross-talk between wires to result in silicon chips 102 that operate at high speeds with high reliability. Additionally, materials not containing lead are becoming standard as the materials for solder bumps 110 in consideration of friendliness to the environment.

FIG. 6 is a sectional photograph for explaining the conditions whereby cracks occur in thin FC-BGA-type semiconductor devices. When a low-k film is used, low-k films can be made more porous (brittle) in order to reduce the dielectric constant, thus making them much more susceptible to damage such as cracks and the like. As a result, as shown in the drawing, cracks often occur in low-k films contained in the circuit layers of silicon chips 102, and cracks often occur at the interface between the polyimide resin coat of silicon chips 102 and the underfill 112.

On the other hand, FIG. 7 is a conceptual diagram for explaining the mechanism whereby cracks occur in the solder bumps of a thin FC-BGA type semiconductor device. Thus, when using a conventional multilayer substrate 108, the coefficient of thermal expansion of the silicon chip 102 is about 3-4 ppm/° C. For example, the coefficient of thermal expansion in the XY direction is about 17.6 ppm/° C. and the coefficient of thermal expansion in the Z direction is about 64.1, so the solder bumps 110 provided between the silicon chip 102 and the multilayer substrate 108 will be subjected to a large stress due to changes in the temperature conditions.

Nevertheless, since lead-free solder bumps 110 are not sufficiently strong, cracks can occur at the interfaces between solder bumps 110 and silicon chips 102 or multilayer substrates 108. Thus, when lead-free solder bumps 110 are used in conventional thin FC-BGA type semiconductor devices, lead-free solder bumps are often more brittle than lead-containing solder bumps, as a result of which the solder bumps 110 are more susceptible to fatigue damage in thermal shock tests.

In contrast, by making the aforementioned stress calculations in Embodiment 1, the present inventors found a relationship to be satisfied by the Tg of the underfill by TMA analysis in order to obtain optimal underfill properties in a thin FC-BGA type semiconductor device, and discovered that the reliability in thermal shock tests can be markedly improved in the semiconductor packages 100 indicated as Embodiments 1-4 as compared with conventional thin FC-BGA type semiconductor devices.

That is, according to the structure of the semiconductor packages 100 of Embodiments 1-4, when flip-chip mounting a silicon chip 102 onto a multilayer substrate 108 with a structure with a thin core 104, a core 104 with a low coefficient of thermal expansion is used in the multilayer substrate 108 and the coefficient of thermal expansion and glass transition point of the underfill 112 are appropriately designed in accordance with the thickness and coefficient of thermal expansion of the core 104, as a result of which it is possible to reduce stresses inside the semiconductor package 100 caused by deformation of the multilayer substrate 108 due to temperature changes, thus suppressing damage to the semiconductor package 100 due to temperature changes.

Here, according to the aforementioned stress calculations, in conventional thin FC-BGA type semiconductor packages 100, the coefficient of thermal expansion of the core 104 is high, so that in the regions of core 104 thicknesses of at most 500 µm, it is difficult to satisfy the four demands for (i) protection of the low-k films in the silicon chip 102, (ii) protection of the solder bumps 110, (iii) reduced warpage of the silicon chip 102 and (iv) protection against fillet delamination of the underfill 112 at the side surfaces of the silicon chip 102, no matter how the coefficient of thermal expansion and the glass transition point of the underfill 112 are adjusted.

On the other hand, with the results of the aforementioned stress calculations, the present inventors discovered as a result of analysis of the semiconductor packages 100 of Embodiments 1-4 that in the semiconductor packages 100 of Embodiments 1-4, the coefficient of thermal expansion of the core 104 is small, so that even in the regions of core 104 thicknesses of at most 500 µm, it is possible to satisfy, in a well-balanced way, the four demands for (i) protection of the low-k films in the silicon chip 102, (ii) protection of the solder bumps 110, (iii) reduced warpage of the silicon chip 102 and (iv) protection against fillet delamination of the underfill 112 at the side surfaces of the silicon chip 102, by adjusting the coefficient of thermal expansion and the glass transition point of the underfill 112.

That is, the semiconductor packages 100 of Embodiments 1-4 are all semiconductor packages 100 comprising a multilayer substrate 108 having a core 104 and buildup layers 106; a silicon chip connected to the multilayer substrate 108 via solder bumps 110; and an underfill 102 filling the gap between the silicon chip 102 and the multilayer substrate 108. Additionally, the thickness of the core 104 is at most 500 µm, the coefficient of thermal expansion of the core 104 from room temperature to the glass transition temperature in the planar direction is at most 15 ppm/° C., and the coefficient of thermal expansion of the core 104 from room temperature to the glass transition temperature in the thickness direction is at most 20 ppm/° C. Additionally, the coefficient of thermal expansion of the underfill 102 from room temperature to the glass transition temperature is at least 15 ppm/° C. and less than 30 ppm/° C., and the glass transition temperature Tg (° C.) of the underfill 102 by TMA analysis satisfies the equation $75 \leq Tg \leq 112.5T+95$, where T (mm) is the thickness of the core 104.

According to this structure, when a silicon chip 102 is flip-chip mounted on a buildup-type multilayer substrate 108 with a structure with a thinned core 104, a core with a low coefficient of thermal expansion is used in the multilayer substrate 108, and the coefficient of thermal expansion and glass transition point of the underfill 112 are appropriately designed in accordance with the thickness and coefficient of thermal expansion of the core 104, thereby reducing stresses occurring inside the semiconductor package 100 by deformations of the multilayer substrate 108 due to temperature changes and suppressing damage to the semiconductor package 100 due to temperature changes.

Additionally, in all of the semiconductor packages 100 of Embodiments 1-4, the core 104 is formed by impregnating a fiber matrix with a resin composition containing a cyanate resin, a phenol resin, an epoxy resin and an inorganic filler, then curing, thereby maintaining the various properties such as strength necessary in the core 104 and satisfying the aforementioned conditions of the coefficient of thermal expansion. As a result, by appropriately designing the coefficient of thermal expansion and glass transition point of the underfill 112 in accordance with the thickness and composition of the core 104, it is possible to reduce stresses occurring inside the semiconductor package 100 by deformations of the multilayer substrate 108 due to temperature changes and suppressing damage to the semiconductor package 100 due to temperature changes.

Additionally, the semiconductor package 100 of Embodiment 1 is such that the multilayer substrate 108 has three or less buildup layers, while the remaining structure remains the same as with the other Embodiments 2-4, so that as indicated by the test data given below, the glass transition temperature Tg (° C.) of the underfill 112 by TMA analysis particularly satisfies the equation $50T+75 \leq Tg < 125T+95$, where T (mm) is the thickness of the core 104, which is not satisfied by the other layer structures.

Herebelow, the materials and production method of the multilayer substrate used in Embodiments 1-4 shall be explained.

<Regarding the Core>

The core 104 used in Embodiments 1-4 is not particularly limited as long as it satisfies the above conditions on thickness and coefficient of thermal expansion and has the appropriate strength. As an example, a board-type substrate (so-called prepreg) formed by impregnating a fiber substrate (such as, for example, a fiberglass sheet) with a resin composition comprising a cyanate resin, a phenol resin, an epoxy resin and an inorganic filler, then curing, can be suitably used.

By including a cyanate resin in the resin composition forming the core 104, it is possible to reduce the coefficient of thermal expansion of the core 104, thus improving the electrical properties (low dielectric constant, low dielectric tangent) and mechanical strength of the core 104. Cyanate resins here include not only cyanate resins but also the prepolymers of cyanate resins.

The above-mentioned cyanate resins can be obtained, for example, by reacting a cyanogen halide and a phenol, and prepolymerizing by a method such as heating or the like as needed. Specific examples include bisphenol type cyanate resins such as novolac type cyanate resins, bisphenol A type cyanate resins, bisphenol E type cyanate resins, tetramethylbisphenol F type cyanate resins. Of these, novolac type cyanate resins are preferable. These are capable of improving heat resistance by increasing the crosslinking density and improving flame retardance of the resin composition. This is because novolac-type cyanate resins form triazine rings after the curing reaction. Furthermore, novolac-type cyanate resins have a high proportion of benzene rings in their structure, and are easily carbonized. Furthermore, even if the thickness of the core is made 0.5 mm (500 µm) or less, a laminated board prepared by curing the core 104 can be provided with exceptional rigidity. In particular, it has exceptional rigidity when heated, so it has particularly good reliability when mounting semiconductor elements.

As an example of the above novolac-type cyanate resin, it is possible to use a compound such as indicated by Formula (1).

[Formula 1]

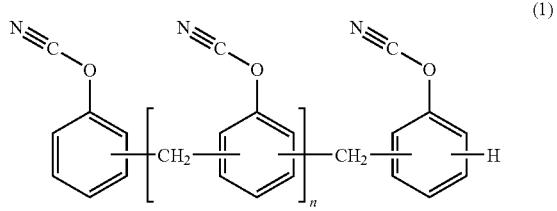

While there are no particular restrictions on the average number of repeating units n in the novolac-type cyanate resin indicated by Formula (I), it is preferably 1-10 and more preferably 2-7. If the average number of repeating units n is less than the aforementioned lower limit value, then the heat resistance of the novolac-type cyanate resin can decrease, and oligomers can be released or evaporate when heated. Additionally, if the average number of repeating units n exceeds the aforementioned upper limit value, the melt viscosity can become too high, thus reducing the formability of the core 104.

While the weight-average molecular weight of the above cyanate resin is not particularly limited, the weight-average molecular weight is preferably 500-4,500, and more preferably 600-3,000. If the weight-average molecular weight is less than these lower limit values, then tackiness can occur when the core 104 is produced, so that cores 104 may stick together or resin transfer may occur when they come into contact with each other. Additionally, if the weight-average molecular weight exceeds these upper limit values, the reaction can become too quick, so that when a substrate (in particular, a circuit board) is formed, molding defects can occur and interlayer peeling strength can decrease. The weight-average molecular weight of the above-mentioned cyanate resin and the like can be measured, for example, by GPC (gel permeation chromatography, standard substance: polystyrene conversion).

Additionally, while not particularly limited, the above cyanate resin may be one type used alone, or a combination of two or more types of different weight-average molecular weight used in combination, or one or more types used in combination with their prepolymers.

While the amount of the thermosetting resin is not particularly limited, it is preferably 5-50 wt % with respect to the entire resin composition, more preferably 20-40 wt %. If the amount is less than these lower limit values, then it can be difficult to form the core 104, and if these upper limit values are exceeded, the strength of the core 104 can decrease.

Additionally, by including an inorganic filler in the resin composition forming the core 104, it is possible to maintain exceptional strength even when the core 104 is made thin (thickness of 0.5 mm or less). Furthermore, reduced thermal expansion of the core 104 can also be alleviated.

Examples of the inorganic filler include baked clay; unbaked clay; silicates such as mica and glass; oxides such as titanium oxide, alumina, silica and fused silica; carbonates such as calcium carbonate, magnesium carbonate and hydrotalcite; hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanates such as strontium titanate and barium titanate. As the inorganic filler, it is possible to use one of these alone, or to use two or more in combination. Among these, silica is particularly preferable, and fused silica (particularly spherical fused silica) is preferably for its low thermal expansion. While it may be in crushed or spherical form, a method of use appropriate to the purpose is used, such as by using spherical silica to lower the melt viscosity of the resin composition in order to achieve impregnation into the fiber substrate.

While the average particle size of the inorganic filler is not particularly limited, it should preferably be 0.01-5.0 µm, more preferably 0.1-2.0 µm. If the particle size of the inorganic filler is less than these lower limit values, then the viscosity of the varnish can be too high, thus affecting productivity when preparing the core 104. Additionally, if these upper limit values are exceeded, segregation of the inorganic filler in the varnish can occur. The average particle size can be measured, for example, by a particle size analyzer (Horiba, LA-500).

Additionally, while not particularly limited, the above-mentioned inorganic filler may be an inorganic filler with a monodispersion of average particle size or an inorganic filler with a polydispersion of average particle sizes. Furthermore, it is possible to use one type or two or more types in combination of the inorganic filler with a monodispersion and/or polydispersion of average particle sizes.

Furthermore, it is preferable to use spherical silica (especially spherical fused silica) with an average particle size of 5.0 µm or less, and more preferably spherical fused silica with an average particle size of 0.01-2.0 µm. As a result, it is possible to improve the filling of the inorganic filler.

While the amount of the inorganic filler is not particularly limited, it should preferably be 20-80 wt %, more preferably 30-70 wt % with respect to the entire resin composition. As long as the amount is within the above range, it is possible to achieve low thermal expansion and low moisture absorption in particular.

By including an epoxy resin (substantially not including halogen atoms) in the resin composition forming the core 104, it is possible to improve the hygroscopic solder heat resistance and flame retardance of the core 104.

Examples of the aforementioned epoxy resin include bisphenol type epoxy resins such as bisphenol A type epoxy resins, bisphenol F type epoxy resins, bisphenol E type epoxy resins, bisphenol S type epoxy resins, bisphenol M type epoxy resins, bisphenol P type epoxy resins and bisphenol Z type epoxy resins; novolac type epoxy resins such as phenol novolac type epoxy resins and cresol novolac type epoxy resins; arylalkylene type epoxy resins such as biphenyl type epoxy resins, xylene type epoxy resins and biphenylaralkyl type epoxy resin; naphthalene type epoxy resins, anthracene type epoxy resins, phenoxy type epoxy resins, diclyclopentadiene type epoxy resins, norbornene type epoxy resins, adamantane type epoxy resins and fluorene type epoxy resins. As epoxy resins, it is possible to use one of these alone, a combination of two or more types having different weight-average molecular weights, or a combination of one or more types with their prepolymers. Among these epoxy resins, arylalkylene type epoxy resins are particularly preferred. As a result, it is possible to improve the hygroscopic solder heat resistance and flame retardance.

The aforementioned arylalkylene type epoxy resin refers to an epoxy resin having at least one arylalkylene group among the repeating units. Examples include xylylene type epoxy resins and biphenyldimethylene type epoxy resins. Among these, biphenyldimethylene type epoxy resins are preferable. The biphenyldimethylene type epoxy resin can, for example, be indicated by Formula (2).

[Formula 2]

(2)

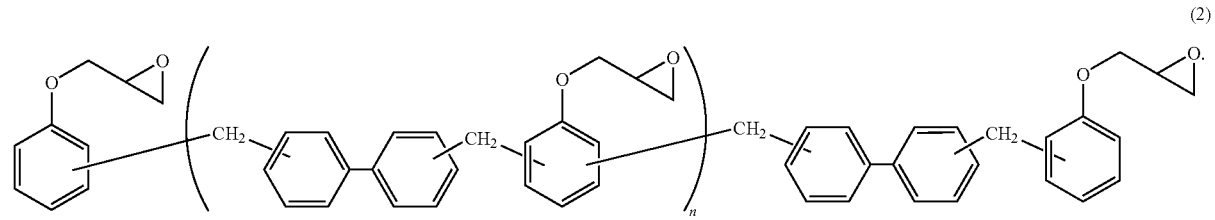

The average number of repeating units n in the biphenyldimethylene type epoxy resin indicated by the above Formula (II) is not particularly limited, but is preferably 1-10, and more preferably 2-5. If the average number of repeating units n is less than the aforementioned lower limit values, then the biphenyldimethylene type epoxy resin can tend to crystallize, and the solubility in general purpose solvents can be relatively reduced, thus making it difficult to handle. Additionally, if the number of repeating units n exceeds the above upper limits, then the fluidity of the resin can decrease and cause molding defects or the like.

While the amount of the epoxy resin is not particularly limited, it should preferably be 1-55 wt %, more preferably 2-40 wt % of the entire resin composition. If the amount is less than these lower limit values, then the reactivity of the cyanate resin can decrease, thus reducing the moisture resistance of the resulting product, and if the upper limit values are exceeded, then the heat resistance can be reduced.

While the weight-average molecular weight of the aforementioned epoxy resin is not particularly limited, the weight-average molecular weight is preferably 500-20,000, and more preferably 800-15,000. If the weight-average molecular weight is less than these lower limit values, then tackiness can occur in the core 104, and if these upper limit values are exceeded, then the impregnation of the fiberglass substrate during production of the core 104 can decrease so as not to enable a uniform product to be obtained. The weight-average molecular weight of the epoxy resin can, for example, be measured by GPC.

By including a phenol resin in the resin composition forming the core 104, it is possible to further improve the hygroscopic solder heat resistance of the core 104.

Examples of the above-mentioned phenol resin include novolac type phenol resins, resol type phenol resins and arylalkylene type phenol resins. As the phenol resin, it is possible to use one of these types alone, two or more types having different weight-average molecular weights in combination, or a combination of one or more types with their prepolymers.

Among these, arylalkylene type phenol resins are particularly preferable. As a result, it is possible to further improve the hygroscopic solder heat resistance.

Examples of the above-mentioned arylakylene type phenol resin include xylene type phenol resins and biphenyldimethylene type phenol resins.

Biphenyldimethylene type phenol resins can, for example, be indicated by the Formula (3).

[Formula 3]

(3)

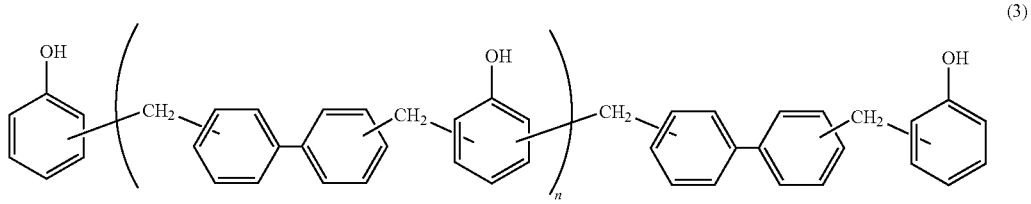

The number of repeating units n in the biphenyldimethylene type phenol resin indicated by the above Formula (III) is not particularly limited, but should preferably be 1-12, and more preferably 2-8. If the average number of repeating units n is less than these lower limit values, then the heat resistance can be reduced. Additionally, if these upper limit values are exceeded, then the compatibility with other resins can decrease, thus reducing the processability.

The aforementioned combination of cyanate resin (especially novolac type cyanate resin) and arylalkylene type phenol resin can be used to control the crosslinking density and to easily control the reactivity.

While the amount of the aforementioned phenol resin is not particularly limited, it should preferably be 1-55 wt %, and more preferably 5-40 wt % with respect to the entire resin composition. If the amount is less than these lower limit values, then the heat resistance can be reduced, and if these upper limit values are exceeded, the low thermal expansion properties may suffer.

While the weight-average molecular weight of the above-mentioned phenol resin is not particularly limited, the weight-average molecular weight should preferably be 400-18,000, and more preferably 500-15,000. If the weight-average molecular weight is less than these lower limit values, then the core 104 can become tacky, and if these upper limit values are exceeded, the impregnation of the fiberglass substrate at the time of production of the core 104 can be reduced, so as not to be able to obtain a uniform product. The weight-average molecular weight of the phenol resin can, for example, be measured by GPC.

Furthermore, when the core 104 is produced using a combination of the above-mentioned cyanate resins (particularly novolac type cyanate resins), the above-mentioned phenol resins (particularly arylalkylene type phenol resins, especially biphenyldimethylene type phenol resins) and the above-mentioned epoxy resins (arylalkylene type epoxy resins, especially biphenyldimethylene type epoxy resins), it is possible to obtain particularly exceptional dimensional stability.

The above-described resin composition is not particularly limited, but preferably uses a coupling agent. The above-mentioned coupling agent can improve the heat resistance, particularly the solder heat resistance after wetting, by improving the wettability of the interface between the above-mentioned thermosetting resin and the above-mentioned inorganic filler, thereby evenly attaching the thermosetting resin and inorganic filler to the fiber substrate.

While any commonly used coupling agent may be used, it is preferable to use at least one type of coupling agent chosen from among epoxysilane coupling agents, cationic silane coupling agents, aminosilane coupling agents, titanate coupling agents and silicone oil coupling agents. As a result, it is possible to improve the wettability with the interface of the inorganic filler, thereby improving the heat resistance.

The amount of the coupling agent added will depend on the specific surface area of the inorganic filler, and is therefore not particularly limited, but it should preferably be 0.05-3 parts by weight, particularly 0.1-2 parts by weight, with respect to 100 parts by weight of the inorganic filler. If the content is less than these lower limits, it is not possible to adequately cover the inorganic filler, thus reducing the effect of increased heat resistance, and when these upper limits are exceeded, the reaction is affected and the bending strength is reduced.

The above-mentioned resin composition may also use a curing promoter as needed. Examples include organic metal salts such as zinc naphthenate, cobalt naphthenate, tin octylate, cobalt octylate, cobalt (II) bis-acetylacetonate and cobalt (III) tris-acetylacetonate; tertiary amines such as triethylamine, tributylamine and diazabicyclo[2,2,2]octane; imidazoles such as 2-phenyl-4-methylimidazole, 2-ethyl-4-ethylimidazole, 2-phenyl-4-methylimidazole, 2-phenyl-4-methyl-5-hydroxyimidazole and 2-phenyl-4,5-dihydroxyimidazole; phenol compounds such as phenol, bisphenol A and nonylphenol; organic acids such as acetic acid, benzoic acid, salicylic acid and paratoluene sulfonic acid; and mixtures thereof. As the curing promoter, it is possible to use one of these, including derivatives thereof, alone, or to use two or more types, including derivatives thereof, in combination.

While the amount of the curing promoter is not particularly limited, it should preferably be 0.05-5 wt %, and more preferably 0.2-2 wt % of the above-mentioned resin composition in its entirety. If the amount is less than these lower limits, then the curing promotion effect may not occur, and if these upper limits are exceeded, then the storability of the core 104 can be reduced.

The above-described resin composition may be used in combination with thermoplastic resins such as phenoxy resins, polyimide resins, polyamideimide resins, polyphenylene oxide resins, polyether sulfone resins, polyester resins, polyethylene resins and polystyrene resins; polystyrene type thermoplastic elastomers such as styrene-butadiene copolymers and styrene-isoprene copolymers; thermoplastic elastomers such as polyolefin-type thermoplastic elastomers, polyamide type elastomers and polyester type elastomers; and diene type elastomers such a polybutadiene, epoxy-modified polybutadiene, acryl-modified polybutadiene and methacryl-modified polybutadiene.

Additionally, it is possible to add additives other than the ingredients described above to the above-described resin composition, such as pigments, dyes, defoaming agents, leveling agents, UV absorbing agents, foaming agents, antioxidants, flame retardants and ion sequestering agents as needed.

Next, the prepreg shall be described.

The core 104 which is a board-shaped substrate (so-called prepreg) which is formed by impregnating a fiber substrate (such as a fiberglass sheet) with the above-described resin composition and curing is suitable for manufacture of interposers and motherboards which are printed wiring boards that excel in various properties such as dielectric properties and mechanical and electrical connection reliability in high-temperature high-moisture conditions.

Examples of the fiber substrate that can be used here include fiberglass substrates of glass fabrics and glass non-woven fabrics; synthetic resin substrates composed of fabrics or non-woven fabrics having polyamide resin fibers such as polyamide resins, aromatic polyamide resin fibers and wholly aromatic polyamide resin fibers, polyimide resin fibers, fluoride resin fibers and the like as main constituents; and organic fiber substrates such as paper substrates having as main constituents craft paper, cotton linter paper, and mixed papers of linter and craft pulp. Of these, fiberglass substrates are preferred. As a result, the strength and moisture absorption rate of the core 104 can be improved. Additionally, the coefficient of thermal expansion of the core 104 can be reduced.

Examples of methods of impregnating the fiber substrate with the above-described resin composition include, for example, methods of preparing a resin varnish using the above-described resin compositions and immersing the fiber substrate in the resin varnish, a method of applying with various types of coater, and a method of spraying. Of these, immersing the fiber substrate in the resin varnish is preferred. As a result, the rate of impregnation of the resin composition into the fiber substrate can be increased. When immersing the fiber substrate in a resin varnish, it is possible to use conventional immersive application equipment.

While the solvent used in the above-described resin varnish should preferably exhibit good solubility to the resin components in the above-described resin composition, a poor solvent may be used within such a range as not to have any detrimental effects. Examples of solvents exhibiting good solubility include acetone, methylethylketone, methylisobutylketone, cyclohexanone, tetrahydrofuran, dimethylformamide, dimethylacetoamide, dimethylsulfoxide, ethylene glycol, cellosolves and carbitols.

While the solid part of the above-described resin varnish is not particularly limited, it should preferably be 40-80 wt %, and more preferably 50-65 wt % of the solid part of the above-described resin composition. As a result, it is possible to further improve the impregnation of the fiber substrate with the resin varnish. By impregnating the above-described fiber substrate with the above-described resin composition and drying at a predetermined temperature such as, for example, 80-200° C., it is possible to obtain a core 104.

<Regarding the Buildup Layer>

Herebelow, the resin composition for forming the buildup layers 106 used in Embodiments 1-4 shall be explained. The resin composition forming the buildup layers 106 is not particularly limited, but is preferably formed of a resin composition containing a thermosetting resin. As a result, it is possible to improve the heat resistance of the insulating resin layer.

Examples of the thermosetting resins include phenol resins such as novolac type phenol resins such as phenol novolac resins, cresol novolac resins and bisphenol A novolac resins, and resol type phenol resins such as unmodified resol phenol resins and oil-modified resol phenol resins modified by paulownia oil, linseed oil or walnut oil; bisphenol type epoxy resins such as bisphenol A epoxy resins, bisphenol F epoxy resins, bisphenol E type epoxy resins, bisphenol S type epoxy resins, bisphenol Z type epoxy resins, bisphenol P type epoxy resins and bisphenol M type epoxy resins; novolac type epoxy resins such a phenol novolac type epoxy resins and cresol novolac epoxy resins; epoxy resins such as biphenyl type epoxy resins, biphenyl aralkyl type epoxy resins, arylalkylene type epoxy resins, naphthalene type epoxy resins, anthracene type epoxy resins, phenoxy type epoxy resins, dicyclopentadiene type epoxy resins, norbornene type epoxy resins, adamantane type epoxy resins and fluorene type epoxy resins; resins having a triazine ring such as urea resins and melamine resins; unsaturated polyester reins; bimaleimide resins; polyurethane resins; diallylphthalate resins; silicone resins; resins having a benzo-oxadine ring; and cyanate resins.

Of these it is possible to use one type alone, to use two or more types having different weight-average molecular weights in combination, or to use one or more types in combination with their prepolymers. Additionally, among these, cyanate resins (including prepolymers of cyanate resins) are particularly preferred. As a result, it is possible to reduce the coefficient of thermal expansion of the insulating resin layer. Furthermore, the electrical properties (low dielectric constant, low dielectric tangent) and mechanical strength of the insulating resin layer are also good.

The above-described cyanate resins can be obtained, for example, by reacting a cyanogen halide and a phenol and prepolymerizing by a method such as heating as needed. Specific examples include bisphenol type cyanate resins such as novolac type cyanate resins, bisphenol A type cyanate resins, bisphenol E type cyanate resins and tetramethylbisphenol F type cyanate resins. Of these, novolac type cyanate resins are preferred. As a result, it is possible to improve the heat resistance due to increases in crosslinking density and to improve the flame retardance of the resin composition. This is because novolac type cyanate resins form triazine rings after the curing reaction. Furthermore, novolac type cyanate resins have a high proportion of benzene rings in their structure, and are easily carbonized.

As an example of the above novolac-type cyanate resin, it is possible to use a compound such as indicated by Formula (4).

[Formula 4]

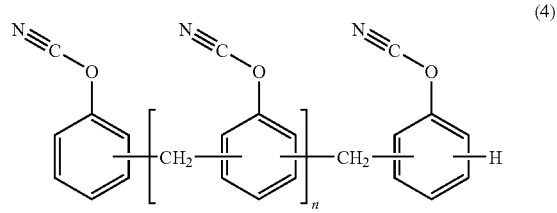

The average number of repeating units n of the novolac type cyanate resin indicated by the above Formula (4) is not particularly limited, but is preferably 1-10, and more preferably 2-7. If the average number of repeating units n is less than the upper limits, then the novolac type cyanate resin will more easily crystallize, and the solubility in common solvents will be relatively reduced, making it difficult to handle. Additionally, if the average number of repeating units exceeds the above-described upper limit, then the melt viscosity can become too high, reducing the moldability of the insulating resin layer.

While the weight-average molecular weight of the above cyanate resin is not particularly limited, the weight-average molecular weight is preferably 500-4,500, and more preferably 600-3,000. If the weight-average molecular weight is less than these lower limit values, then the mechanical strength of the cured insulating resin layer can decrease, and when an insulating resin layer is formed, tackiness can occur, causing transfer of the resin. Additionally, if the weight-average molecular weight exceeds these upper limit values, the reaction can become too quick, so that when a substrate (in particular, a circuit board) is formed, molding defects can occur and interlayer peeling strength can decrease. The weight-average molecular weight of the above-mentioned cyanate resin and the like can be measured, for example, by GPC (gel permeation chromatography, standard substance: polystyrene conversion).

Additionally, while not particularly limited, the above-described cyanate resins, including their derivatives, may be one type used alone, two or more types having different weight-average molecular weights used in combination, or one ore more types used in combination with their prepolymers.

The amount of the above-described thermosetting resin is not particularly limited, but is preferably 5-50 wt %, and more preferably 10-40 wt % with respect to the entire resin composition. If the amount is less than these lower limits, then it becomes difficult to form an insulating resin layer, and if these upper limits are exceeded, then the strength of the insulating resin layers can be reduced.

When using cyanate resins (especially novolac type cyanate resins) as the thermosetting resins in the buildup layers 106, they should preferably be used in conjunction with an epoxy resin (substantially free of halogen atoms). Examples of the above-described epoxy resins include bisphenol type epoxy resins such as bisphenol A type epoxy resins, bisphenol F type epoxy resins, bisphenol E type epoxy resins, bisphenol S type epoxy resins, bisphenol Z type epoxy resins, bisphenol P type epoxy resins and bisphenol M type epoxy resins; novolac type epoxy resins such as phenol novolac type epoxy resins and cresol novolac type epoxy resins; arylalkylene type epoxy resins such as biphenyl type epoxy resins, xylene type epoxy resins and biphenylaralkyl type epoxy resin; naphthalene type epoxy resins, anthracene type epoxy resins, phenoxy type epoxy resins, diclyclopentadiene type epoxy resins, norbornene type epoxy resins, adamantine type epoxy resins and fluorene type epoxy resins.

As epoxy resins, it is possible to use one of these alone, a combination of two or more types having different weight-average molecular weights, or a combination of one or more types with their prepolymers. Among these epoxy resins, arylalkylene type epoxy resins are particularly preferred. As a result, it is possible to improve the hygroscopic solder heat resistance and flame retardance.

The aforementioned arylalkylene type epoxy resin refers to an epoxy resin having at least one arylalkylene group among the repeating units. Examples include xylylene type epoxy resins and biphenyldimethylene type epoxy resins. Among these, biphenyldimethylene type epoxy resins are preferable. The biphenyldimethylene type epoxy resin can, for example, be indicated by Formula (5).

[Formula 5]

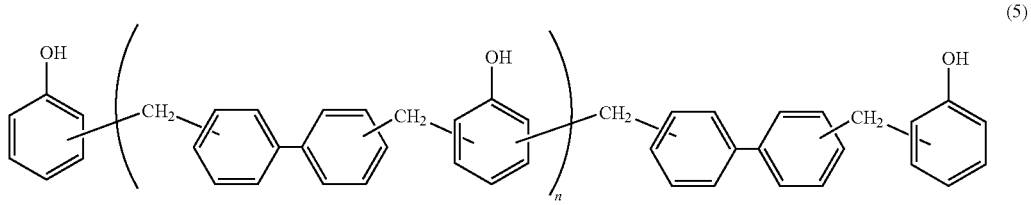

The average number of repeating units n in the biphenyldimethylene type epoxy resin indicated by the above Formula (II) is not particularly limited, but is preferably 1-10, and more preferably 2-5. If the average number of repeating units n is less than the aforementioned lower limit values, then the biphenyldimethylene type epoxy resin can tend to crystallize, and the solubility in general purpose solvents can be relatively reduced, thus making it difficult to handle. Additionally, if the number of repeating units n exceeds the above upper limits, then the fluidity of the resin can decrease and cause molding defects or the like. By setting the number of repeating units n within the above range, it is possible to result in a resin that is exceptionally well-balanced in these properties.

While the amount of the epoxy resin is not particularly limited, it should preferably be 1-55 wt %, and more preferably 5-40 wt % of the entire resin composition. If the amount is less than these lower limit values, then the reactivity of the cyanate resin can decrease, thus reducing the moisture resistance of the resulting product, and if the upper limit values are exceeded, then the coefficient of thermal expansion and the heat resistance can be reduced.

While the weight-average molecular weight of the aforementioned epoxy resin is not particularly limited, the weight-average molecular weight is preferably 500-20,000, and more preferably 800-15,000. If the weight-average molecular weight is less than these lower limit values, then tackiness can occur on the surface of the insulating resin layer, and if these upper limit values are exceeded, then the solder heat resistance can decrease. By setting the weight-average molecular weight within the above range, it is possible to obtain a result that is exceptionally well-balanced in these properties. The weight-average molecular weight of the epoxy resin can, for example, be measured by GPC.

The resin composition used in the buildup layer 106 should preferably contain a film-forming resin. As a result, it is possible to further improve the film forming ability and handling when producing an insulating resin layer with a substrate. Examples of the film-forming resin include phenoxy type resins, bisphenol F type resins and olefin type resins.

As the above-mentioned film-forming resin, including derivatives thereof, it is possible to use one type alone, to use two types having different weight-average molecular weights in combination, or to use one or more types in combination with their prepolymers. Of these, phenoxy type resins are preferred. As a result, it is possible to improve the heat resistance and the flame retardance.

While not particularly limited, examples of the above-described phenoxy resin include phenoxy resins having bisphenol skeletal structures such as phenoxy resins having a bisphenol A skeletal structure, phenoxy resins having a bisphenol F skeletal structure, phenoxy resins having a bisphenol S skeletal structure, phenoxy resins having a bisphenol M skeletal structure, phenoxy resins having a bisphenol P skeletal structure and phenoxy resins having a bisphenol Z skeletal structure; phenoxy resins having an anthracene skeletal structure, phenoxy resins having a fluorene skeletal structure, phenoxy resins having a dicyclopentadiene skeletal structure, phenoxy resins having a norbornene skeletal structure, phenoxy resins having a naphthalene skeletal structure, phenoxy resins having a biphenyl skeletal structure and phenoxy resins having an adamantane skeletal structure.

Additionally, as the phenoxy resin, it is possible to use structures having a plurality of types of these skeletal structures, and to use phenoxy resins wherein the proportion of the respective skeletal structures differs. Furthermore, a plurality of types of phenoxy resins with different skeletal structures can be used, a plurality of types of phenoxy resins having different weight-average molecular weights can be used, or they can be used in conjunction with prepolymers thereof.

Of these, it is possible to use phenoxy resins having a biphenyl skeletal structure and a bisphenol S skeletal structure. As a result, the glass transition temperature can be raised due to the rigidity of the biphenyl skeletal structure, while improving the adherence of plating metals when fabricating multilayer printed circuit boards due to the bisphenol S skeletal structure.

Additionally, phenoxy resins having a bisphenol A skeletal structure and a bisphenol F skeletal structure may be used. As a result, it is possible to improve the adhesion to the inner layer circuit board when fabricating a multilayer printed circuit board. Furthermore, it is possible to use a combination of the above-described phenoxy resin having a biphenyl skeletal structure and bisphenol S skeletal structure, and a phenoxy resin having a bisphenol A skeletal structure and a bisphenol F skeletal structure.

While the molecular weight of the above-described film-forming resin is not particularly limited, the weight-average molecular weight should preferably be 1000-100000, and more preferably 10000-60000. If the weight-average molecular weight of the film-forming resin is less than these lower limit values, the effect of improving the film forming ability may not be adequate. On the other hand, if these upper limit values are exceeded, the solubility of the film-forming resin can be reduced. By setting the weight-average molecular weight of the film-forming resin to be in the above range, it is possible to obtain a resin that is exceptionally well-balanced in these properties.

While the amount of the film-forming resin is not particularly limited, it should preferably be 1-40 wt %, and more preferably 5-30 wt % with respect to the entire resin composition. If the amount of the film-forming resin is less than these lower limit values, then the effect of improving the film-forming ability may not be adequate. On the other hand, if these upper limit values are exceeded, then the relative amount of cyanate resin is reduced, thus reducing the effect of providing a low coefficient of thermal expansion. By setting the amount of film-forming resin to be in the above range, it is possible to obtain a resin that is well-balanced in these properties.

The above-described thermosetting resin and film-forming resin used in the buildup layers 106 should both preferably be substantially free of halogen atoms. As a result, it is possible to provide flame retardance without the use of halogen compounds. Here, being substantially free of halogen atoms means, for example, that the halogen atom content in the epoxy resin or phenoxy resin is 0.15 wt % or less (JPCA-ES01-2003).

As the resin compositions used in the buildup layers 106, curing promoters may be used as needed. It is possible to use publicly known substances as the above-described curing promoter. Examples include imidazole compounds; organic metal salts such as zinc naphthenate, cobalt naphthenate, tin octylate, cobalt octylate, cobalt (II) bis-acetylacetonate and cobalt (III) tris-acetylacetonate; tertiary amines such as triethylamine, tributylamine and diazabicyclo[2,2,2]octane; phenol compounds such as phenol, bisphenol A and nonylphenol; organic acids such as acetic acid, benzoic acid, salicylic acid and paratoluene sulfonate; or mixtures thereof. As the curing promoter, it is possible to use one of these, including derivatives thereof, alone, or to use two or more types, including derivatives thereof, in combination.

Among these curing promoters, imidazole compounds are particularly preferred. As a result, it is possible to raise the hygroscopic solder heat resistance. Additionally, while the above imidazole compound is not particularly limited, it should preferably have compatibility with the above-described cyanate resins, epoxy resins and film-forming resin components.

Here, having compatibility with the above cyanate resins, epoxy resins and film-forming resin components refers to the property that when the imidazole compound is mixed with the above-described cyanate resins, epoxy resins and film-forming resin components, or when the imidazole compound is mixed with the above-described cyanate resins, epoxy resins and film-forming resin components together with an organic solvent, they can be dissolved to substantially molecular level, or dispersed to a state proximate thereto.

By using such an imidazole compound in the above-described resin composition, it is possible to effectively promote reactions of the cyanate resins or epoxy resins, and to provide equivalent properties even when the amount of the imidazole compound is reduced. Furthermore, a resin composition using such an imidazole compound can be cured with a high uniformity due to the microscopic matrix units between resin components. As a result, it is possible to improve the insulating ability and heat resistance of the resin layers formed on the multilayer printed wiring board.

When buildup layers 106 which are insulating resin layers formed from the above-described resin materials are subjected to surface roughening processes using oxidizing agents such as permanganates and dichromates, they are capable of forming many microscopic bumps of high uniformity on the surface of the insulating layer after the roughening process. Since the smoothness of the roughened surface is high when performing metal plating of the surface of the insulating resin layer after roughening, it is possible to precisely form fine conductor circuits. Additionally, since the microscopic bumps increase the anchoring effect, a high level of adhesion can be achieved between the insulating resin layer and the plating metal.

Examples of the above-mentioned imidazole compounds used in the above-described resin composition include 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl-(1')]-ethyl-s-triazine, 2-phenyl-4,5-dihydroxymethylimidazole and 2-phenyl-4-methyl-5-hydroxymethylimidazole.

Of these, an imidazole compound chosen from among 1-benzyl-2-methylimidazole, 1-benzyl-2-phenylimidazol and 2-ethyl-4-methylimidazole is preferable. Since these imidazole compounds have particularly exceptional compatibility, they enable highly uniform cured articles to be obtained, and are capable of forming fine and uniform roughened surfaces, enabling fine conductor circuits to be easily formed and providing high heat resistance to multilayer printed circuit boards.

While the amount of the imidazole compound is not particularly limited, it should preferably be 0.01-5 wt %, and more preferably 0.05-3 wt % with respect to the total amount of the cyanate resin and the epoxy resin. As a result, the heat resistance can be particularly improved.

Additionally, the resin composition used in the buildup layers 106 should preferably contain an inorganic filler. As a result, it is possible to improve the flame retardance and the low coefficient of thermal expansion. Additionally, by combining the above-described cyanate resins and/or their prepolymers (especially novolac type cyanate resins) with inorganic fillers, it is possible to improve the coefficient of expansion.

Examples of the inorganic filler include baked clay; unbaked clay; silicates such as mica and glass; oxides such as titanium oxide, alumina, silica and fused silica; carbonates such as calcium carbonate, magnesium carbonate and hydrotalcite; hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanates such as strontium titanate and barium titanate. As the inorganic filler, it is possible to use one of these alone, or to use two or more in combination. Among these, silica is particularly preferable, and fused silica (particularly spherical fused silica) is preferably for its low thermal expansion.

While it may be in crushed or spherical form, a method of use appropriate to the purpose is used, such as by using spherical silica to lower the melt viscosity of the resin composition in order to achieve impregnation into the fiber substrate.

While the average particle size of the inorganic filler is not particularly limited, it should preferably be 0.01-5.0 μm, and more preferably 0.1-2.0 μm. If the particle size of the inorganic filler is less than these lower limit values, then the viscosity of the varnish can be too high, when preparing a resin varnish using the above-described resin composition, thus affecting productivity when preparing the insulating sheet with a substrate. Additionally, if these upper limit values are exceeded, segregation of the inorganic filler in the varnish can occur. By setting the average particle size of the inorganic filler in the above range, it is possible to result in a resin composition can be exceptionally well-balanced in these properties.

Additionally, while not particularly limited, the above-mentioned inorganic filler may be an inorganic filler with a monodispersion of average particle size or an inorganic filler with a polydispersion of average particle sizes. Furthermore, it is possible to use one type or two or more types in combination of the inorganic filler with a monodispersion and/or polydispersion of average particle sizes.

Furthermore, while the amount of the inorganic filler is not particularly limited, it should preferably be 20-70 wt %, and more preferably 30-60 wt % with respect to the entire resin composition. If the amount of the inorganic filler is less than these lower limit values, then the effects of low thermal expansion and low moisture absorption can be reduced. Additionally, if these upper limit values are exceeded, the moldability of the insulating resin layer can be reduced by reducing the fluidity of the resin composition. By setting the amount of the inorganic filler in the above range, it is possible to result in a resin composition that is exceptionally well-balanced in these properties.

While the resin composition used in the buildup layers 106 is not particularly limited, it is preferable to use a coupling agent. The above-mentioned coupling agent can improve the heat resistance, especially the hygroscopic solder heat resistance, by improving the wettability of the interface between the above-described thermosetting resin and the above-described inorganic filler.

While any coupling agent that is normally used may be used as the above-described coupling agent, it is particularly preferable to use at least one type of coupling agent chosen from among epoxysilane coupling agents, cationic silane coupling agents, aminosilane coupling agents, titanate coupling agent and silicone oil coupling agents. As a result, it is possible to raise the wettability of the interface with the inorganic filler, thereby improving the heat resistance.

While the amount of the above-described coupling agent is not particularly limited, it should preferably be 0.05-3.00 parts by weight with respect to 100 parts by weight of the inorganic filler. If the amount of the coupling agent is less than these lower limit values, then the effect of covering the inorganic filler and raising the heat resistance can be inadequate. On the other hand, if these upper limits are exceeded, then the bending strength of the insulating resin layer with the substrate can decrease. By setting the amount of the coupling agent within the above range, it is possible to result in a resin composition that is exceptionally well-balanced in these properties.

The resin composition used in the buildup layers 106 may be used in combination with thermoplastic resins such as phenoxy resins, polyimide resins, polyamidimide resins, polyphenylene oxide resins, polyether sulfone resins, polyester resins, polyethylene resins and polystyrene resins; polystyrene type thermoplastic resins such as styrene-butadiene copolymers and styrene-isoprene copolymers; thermoplastic elastomers such as polyolefin type thermoplastic elastomers, polyamide type elastomers and polyester type elastomers; and diene type elastomers such as polybutadiene, epoxy-modified polybutadiene, acryl-modified polybutadiene and methacryl-modified polybutadiene.

Additionally, it is possible to add additives other than the ingredients described above to the above-described resin composition, such as pigments, dyes, defoaming agents, leveling agents, UV absorbing agents, foaming agents, antioxidants, flame retardants and ion sequestering agents as needed.

The resin composition used in the buildup layers 106 may be used to impregnate a fiber substrate such as a fiberglass substrate, or the resin composition may be cured as is. Here, the method of impregnation of the resin composition into the substrate is not particularly limited, but examples include methods of dissolving and dispersing the resin composition into a solvent to prepare a resin varnish, applying the resin varnish to a substrate using various types of coaters, then drying, or methods of spraying the substrate with the resin varnish using a sprayer, then drying.

Of these, a method of applying the resin varnish to the substrate using various coaters such as a comma coater or a die coater, then drying, is preferable. As a result, it is possible to efficiently produce an insulating resin layer with a substrate which is free of voids and having a uniform insulating resin layer thickness.

<Regarding the Method of Fabricating the Multilayer Substrate>

Next, the method of fabricating the multilayer substrate shall be explained.

FIG. 3 is a conceptual diagram for explaining the design of a buildup-type interposer. The multilayer substrate 108 which is the laminated board used in Embodiments 1-4 is formed by laminating at least one of the above-described cores 104, at least one of the above-described buildup layers, and at least one layer of circuit wiring 114 consisting of copper foil on the surfaces thereof. As a result, it is possible to obtain a laminated board with exceptional dielectric properties and mechanical and electrical connection reliability in high temperature and high moisture.

When the core 104 consists of a single prepreg, circuit wiring 114 consisting of a metal foil (such as copper foil) or a dummy circuit consisting of a film is laminated onto both the top and bottom surfaces or one of the surfaces thereof. Additionally, it is possible to have two or more prepregs. If the core 104 is formed from two or more prepregs, circuit wiring 114 consisting of a metal foil (such as copper foil) or a dummy circuit consisting of a film is laminated onto both the top and bottom surfaces or one of the surfaces of the outermost of the laminated prepregs. Next, the laminated prepregs and metal foils are heated and compressed to obtain a core 104. While the heating temperature is not particularly limited, it should preferably be 120-220° C., and more preferably 150-200° C. Additionally, the pressure of compression is not particularly limited, but should preferably be 2-5 MPa, and more preferably 2.5-4 MPa.

Examples of the metals constituting the metal foil include copper and copper alloys, aluminum and aluminum alloys, silver and silver alloys, gold and gold alloys, zinc and zinc alloys, nickel and nickel alloys, tin and tin alloys, and iron and iron alloys. Additionally, examples of the film include polyethylene, polypropylene, polyethylene terephthalate, polyimides and fluorine resins.

Herebelow, the materials and method of production of the underfill used in Embodiments 1-4 shall be explained.

<Regarding the Underfill>

The underfill 112 used in Embodiments 1-4 is not particularly limited as long as it satisfies the above-mentioned conditions for coefficient of thermal expansion and glass transition temperature, but it should preferably comprise an epoxy resin, a hardener, an inorganic filler and a silane coupling agent.

Here, the epoxy resin used in the underfill 112 is not particularly limited as to its molecular weight or structure as long as it has at least two epoxy groups in each molecule. Examples include novolac type phenol resins such as phenol novolac resins, cresol novolac resins and bisphenol A novolac resins; phenol resins such as resol type phenol resins; novolac type epoxy resins such as phenol novolac type epoxy resins and cresol novolac type epoxy resins; bisphenol type epoxy resins such as bisphenol A type epoxy resins and bisphenol F type epoxy resins; aromatic glycidyl amine type epoxy resins such as N,N-diglycidyl aniline, N,N-diglycidyl toluidine, diaminodiphenyl methane type glycidyl amines and aminophenol type glycidyl amines; epoxy resins such as hydroquinone type epoxy resins, biphenyl type epoxy resins, stilbene type epoxy resins, triphenolmethane type epoxy resins, triazine nucleus-containing epoxy resins, dicyclopentadiene-modified phenol type epoxy resins, naphthol type epoxy resins, naphthalene type epoxy resins and aralykyl type epoxy resins such as phenolaralkyl type epoxy resins having a phenylene and/or biphenylene skeletal structure and naphtholaralykyl type epoxy resins having a phenylene and/or biphenylene skelectal structure; and aliphatic epoxy resins such as alicyclic epoxy resins such as vinylcyclohexene dioxide, dicyclopentadiene oxide and alicyclic diepoxy-adipate.

In this case, those having a structure wherein a glycidyl ether structure or glycidyl amine structure is bound to an aromatic ring are preferable in view of their heat resistance, chemical properties and moisture resistance, and the amount of aliphatic or alicyclic epoxy resins used should be restricted in view of the reliability, especially the adhesion. These may be used alone or by mixing two or more types. In the present invention, the epoxy resin should preferably be ultimately in liquid form at standard temperature (25° C.) since it takes the form of a liquid encapsulating resin composition for use in an underfill, but an epoxy resin which is solid at standard temperature can be used if it is dissolved in a liquid epoxy resin at room temperature, ultimately putting it into liquid form.

There are not particular limitations on the molecular weight and structure of the hardener used in the underfill 112, as long as it contains in each molecule at least two functional groups capable of forming covalent bonds with epoxy groups in the epoxy resin, with the exception that if the functional groups are acid anhydride groups, it need only contain at least one acid anhydride functional group. Specific examples of functional groups include phenolic hydroxyl groups, acid anhydrides, primary amines and secondary amines.

Examples of hardeners containing at least two phenolic hydroxyl groups include novolac type phenol resins such as phenol novolac resin and cresol novolac resin; modified phenol resins such as triphenolmethane type phenol resins, triphenolpropane type phenol resins, terpene-modified phenol resins and dicyclopentadiene-modified phenol resins; aralkyl type phenol resins such as phenolaralykyl resins having a phenylene and/or biphenylene skeletal structure and naphtholaralykyl resins having a phenylene and/or biphenylene skeletal structure; and bisphenol compounds.

Examples of hardeners comprising at least one acid anhydride functional group include tetrahydric anhydride, hexahydric anhydride, methyltetrahydrophthalic anhydride, methylnadic anhydride, hydrogenated methylnadic anhydride, trialkyltetrahydrophthalic anhydride, methylcyclohexene tetracarboxylic dianhydride, phthalic anhydride, trimellitic anhydride, pyromellitic anhydride, benzophenone tetracarboxylic dianhydride, ethylene glycol bis-anhydrotrimellitate, glycerin bis-(anhydrotrimellitate) monoacetate and dodecenyl succinic anhydride.

Examples of hardeners containing at least two primary amines or secondary amines include alicyclic polyamines such as diethylene triamine, triethylene tetramine, tetraethylene pentamine, m-xylene diamine, trimethylhexamethylene diamine, 2-methylpentamethylene diamine aliphatic polyamine, isophorone diamine, 1,3-bis-aminomethylcyclohexane, bis(4-aminocyclohexyl)methane, norbornene diamine and 1,2-diaminocyclohexane; piperadine-type polyamines such as N-aminoethylpiperadine and 1,4-bis(2-amino-2-methylpropyl)piperadine; and aromatic polyamines such as diaminodiphenylmethane, m-phenylene diamine, diaminodiphenylsulfone, diethyltoluene diamine, trimethylene bis(4-aminobenzoate), polytetramethylene oxide di-P-aminobenzoate, and those represented by Formula 6.

[Formula 6]

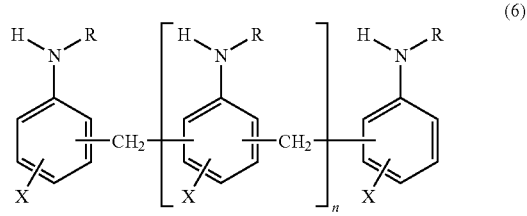

R: hydroxyl group or alkyl group
X: hydroxyl group or alkyl group

The above-described hardeners may be used alone, or by blending two or more hardeners containing the same functional group, or even two or more hardeners containing different functional groups within such a range as not to detract from the pot life or the ability to cure epoxy resins. When considering the purpose of encapsulating semiconductor devices, the phenol resins and aromatic polyamine type hardeners are preferable for properties such as heat resistance and electrical and mechanical properties. Furthermore, it is preferable to use aromatic polyamine type hardeners in view of the closeness of adhesion and moisture resistance. Furthermore, when considering that the embodiment of the present invention is a liquid encapsulating resin composition for use in an underfill, it should preferably be liquid at room temperature (25° C.), specific examples of such aromatic polyamine type hardeners that are available including the hardeners disclosed in JP H10-158365 A (where n=0-2, X=C2H5 and R=H in Formula 1) and the hardeners disclosed in JP 2004-35668 A, 137970 (where n=average 0.3, X=H and R=CH3 in Formula 1).

The amount of the hardener should preferably be in the range of 0.6-1.4, more preferably 0.7-1.3, by active hydrogen equivalent in the hardener with respect to the epoxy equivalent in the epoxy resin. If the active hydrogen equivalent of the hardener is less than 0.6 or more than 1.4, the reactivity and heat resistance of the composition are largely reduced, and is therefore undesirable. However, if the functional groups contained in the hardener are acid anhydride groups, then since two carboxyl function groups are derived from a single acid anhydride functional group, the calculation is performed on the assumption that there are two active hydrogens per acid anhydride functional group.

Examples of the inorganic filler used in the underfill 112 include talc, baked clay; unbaked clay; silicates such as mica and glass; oxides such as titanium oxide, alumina, silica, fused silica (fused spherical silica, fused crushed silica), synthetic silica and crystalline silica; carbonates such as calcium carbonate, magnesium carbonate and hydrotalcite; hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; and nitrides such as aluminum nitride, boron nitride, and silicon nitride. These. inorganic fillers may be used alone or as a mixture. Among these, fused silica, crystalline silica and synthetic silica powders are preferable for being capable of improving the heat resistance, moisture resistance and strength of the resin composition.

While the shape of the inorganic filler is not particularly limited, it should preferably be spherical in view of the filling ability. In this case, the average particle size for the inorganic filler should preferably be 0.1-20 microns, more preferably 0.2-8 microns. If the average particle size exceeds 0.1 microns, the viscosity of the resin composition decreases, thus improving the filling ability, and if it exceeds 20 microns, the composition does not tend to result in resin clogging when the composition is filled into the gaps in the semiconductor device.

The silane coupling agent used in the underfill 112 is not particularly limited as to its molecular weight or structure as long as it has a chemical structure including a hydrocarbon moiety to which a function group is bound and a silicon atom to which an alkoxy group is bound in a single molecule. Examples include epoxy silane coupling agents such as 3-glycidoxypropyl trimethoxysilane, 3-glycidoxypropyl triethoxysilane, 3-glycidoxypropyl trimethoxysilane, 3-glycidoxypropylethyl diethoxysilane and 2-(3,4-epoxycyclohexyl)ethyl trimethoxysilane; silane coupling agents to which acrylate groups are bound such as 3-methacryloxypropyl trimethoxysilane, 3-methacryloxypropyl triethoxysilane, 3-methacryloxypropylmethyl dimethoxysilane, 3-methacryloxypropylethyl diethoxysilane and 3-acryloxypropyl trimethoxysilane; aminosilane coupling agents such as N-aminoethylated aminopropylmethyl dialkoxyxilane, N-aminoethylated aminopropyl trialkoxysilane, 3-aminopropyl trimethoxysilane, 3-aminopropyl triethoxysilane, N-phenyl-γ-aminopropyl trimethoxysilane, N-phenyl-γ-aminopropyl triethoxysilane, N-phenyl-γ-aminobutyl trimethoxysilane and N-phenyl-γ-aminobutyl triethoxysilane; intrinsic aminosilane coupling agents wherein the primary amino groups of aminosilane coupling agents such as N-(1,3-dimethylbutylidene)-3-(triethoxysilyl)propylamine and N-(benzylidene)-3-(triethoxysilyl)propylamine have been protected by reacting with ketones or aldehydes; mercaptosilane coupling agents such as 3-mercaptopropyl trimethoxysilane and 3-mercaptopropylmethyl dimethoxysilane; and silane coupling agents expressing similar functions to mercaptosilane coupling agents by thermal decomposition such as bis(3-triethoxysilylpropyl)tetrasulfide and bis(3-triethoxysilylpropyl)disulfide. Additionally, these silane coupling agents may be pre-hydrolyzed. They may be used alone or by mixing two or more types. In the case of the present invention, epoxysilane coupling agents are preferable for having relatively good adherence to the surfaces of substrates and semiconductor devices (the solder resist on the substrate surfaces, polyimides on silicon chip surfaces and side surfaces of silicon chips). Aminosilane coupling agents, intrinsic aminosilane coupling agents and mercaptosilane coupling agents are preferred for having very good adherence to silicon nitride surfaces and polyimides on silicon chip surfaces.

The method of adding the silane coupling agent can be an integral blending technique of simultaneously blending, dispersing and mixing a coupling agent when mixing the silica filler and organic materials during the process of producing the resin composition; a master batch technique of first dispersing and dissolving a coupling agent into the epoxy resin, aromatic amine hardener and/or other organic additives other than the silica filler beforehand, then blending into the resin composition; and a technique of chemically modifying the silica filler surface layer with the coupling agent beforehand. Any of these blending methods, or a blending method combining these may be used. More preferably, the master batch technique or a blending method combining the master batch technique with the method of chemically modifying the silica surface layer enables a uniform resin composition to be obtained.

The underfill 112 may contain a polybutadiene having epoxy groups as needed. A polybutadiene having epoxy groups is a polymer having 1,3-butadiene monomers as repeating units in the molecule, and the molecular weight and binding structure are not particularly limited as long as there are epoxy groups in the molecules. The number-average molecular weight is preferably in the range of at least 400 and at most 4000, more preferably in the range of at least 600 and at most 3000. If the molecular weight is at least 400, the resin composition is able to maintain the glass transition temperature, and if the molecular weight does not exceed 4000, then the viscosity of the resin composition will not be too high, allowing good productivity to be achieved. Here, the number-average molecular weight is the styrene-converted molecular weight obtained by the GPC method. The content of the epoxy groups should preferably be 3-10%. At 3% or more, it can be mixed and dissolved into the epoxy resin and aromatic amine hardener without separation, and if 10% is not exceeded, it is possible to form sea-island structures after curing, as a result of which reduced stress and added flexibility can be achieved.

As long as the above requirements are satisfied, it may be a random copolymer or block copolymer containing other monomers in the structure, but in this case, it should preferably contain at least 30 wt % of repeating units of 1,3-butadiene monomer. Examples of such a polymer include SBR (styrene butadiene rubber), NBR (nitrile rubber) and epoxylated ABS.

In addition to the ingredients described above, the underfill may include other additives such as diluents, pigments, flame retardants, surfactants, leveling agents, defoaming agents and the like as needed. As the method of producing the resin composition for forming the underfill 112, the ingredients are dispersed and kneaded using equipment such as a planetary mixer, a three roll mill, a heated two roll mill, an automatic kneader or the like, then defoaming in a vacuum. In order to remove volatile portions of the raw material, it is possible to perform a heat treatment at atmospheric pressure or under reduced pressure, within a temperature range in which reactions between the epoxy resin and the hardener or decomposition reactions of the respective ingredients do not occur, for example, to 50-200° C., beforehand or during production. Additionally, aging can be performed within a temperature of 5-35° C. and 12-96 hours, during or as a last step in the dispersion and mixing process.

As the method of filling and encapsulating the gaps between the silicon chip 102 and multilayer substrate 108 of the semiconductor package 100 with the underfill 112, the conventional method is to heat the semiconductor device 100 and the resin composition to form the underfill 112, then to apply the resin composition to the edge of the silicon chip 102, then to allow it to spread into the gap by means of capillary action, but it is also possible to incorporate methods such as tilting the semiconductor device 100 or making use of pressure differences to accelerate filling for the purposes of shortening the production cycle. The filled resin is cured by heating within a temperature range of 100-170° C. for 1-12 hours. Here, the temperature profile can be such that the heat-curing is performed by changing the temperature in stages, such as by heating to 100° C. for 1 hour, followed by heating to 150° C. for 2 hours.

While an embodiment of the present invention has been described above with reference to the drawings, this is only an example of the present invention, and various other arrangements are possible.

For example, while the laminar structure of the multilayer substrate 108 was that of a multilayer substrate 108 having a core 104 in the above embodiment, there is no restriction thereto, and a coreless substrate is possible. Additionally, specific examples of coreless substrates include coreless substrates consisting of six layers (resin layer) and eight layers (resin layers).

Additionally, while the laminar structure of the multilayer substrate 108 in the above embodiment was 1-2-1, 2-2-2, 3-2-3 or 4-2-4, other laminar structures are possible. For example, conditions for the coefficient of thermal expansion and glass transition point of the underfill 112 similar to those of the above embodiment can be achieved with laminar structures of 1-2-3 type, 1-2-5 type, 3-2-1 type and 5-2-1 type. Additionally, the multilayer substrate 108 may be a coreless substrate, in which case a six-layered type or an eight-layered type is used.

Additionally, while the multilayer substrate 108 in the above embodiment was an interposer, it may be another type of circuit board such as a motherboard. In that case, similarly excellent durability is exhibited with respect to changes in temperature conditions even when silicon chips 102 are flip-chip mounted directly onto the motherboard, as long as the coefficient of thermal expansion of the core 104 of the motherboard is adequately small and the conditions for coefficient of thermal expansion and glass transition point of the underfill 112 are satisfied.

EXAMPLES

Herebelow, the present invention shall be explained by providing working examples and comparative examples, but the present invention is not to be construed as being limited to the embodiments described here.

Before performing the below-described examples, the present inventors used a technical database relating to flip-chip mounting stored at Sumitomo Bakelite to perform simulations of the stress calculations explained in connection with Embodiment 1 regarding the optimal underfill properties for a thin FC-BGA. The present inventors used a circuit board of 3-2-3 structure, a package size of 50 mm per side and a silicon chip size of 15 mm per side and a thickness of 725 μm, for FC-BGA mounting as the conditions of the simulation of the stress calculations.

As a result of the simulation, with conventional thin FC-BGA-type semiconductor packages 100, the coefficient of thermal expansion of the core 104 was large, so in areas where the thickness of the core 104 was at most 500 μm or less (core thickness 400 μm and 100 μm), it was difficult to satisfy the four requisites of (i) low-k film protection of the silicon chip 102, (ii) protection of the solder bumps 110, (iii) reduced warpage of the silicon chip 102, and (iv) protection against delamination of the fillet of the underfill 112 at the side surfaces of the silicon chip 102, no matter how the coefficient of thermal expansion and glass transition point of the underfill 112 were adjusted.

On the other hand, with the semiconductor packages 100 according to Embodiments 1-4, the coefficient of thermal expansion of the core 104 was small, so even in the areas where the thickness of the core 104 was 500 μm or less (core thickness 400 μm and 100 μm), it was possible to satisfy the four requisites of (i) low-k film protection of the silicon chip 102, (ii) protection of the solder bumps 110, (iii) reduced warpage of the silicon chip 102, and (iv) protection against delamination of the fillet of the underfill 112 at the side surfaces of the silicon chip 102, by adjusting the coefficient of thermal expansion and glass transition point of the underfill 112.

The below-given examples were performed to verify the results of the above simulation by means of empirical data, and further to verify that they are established even when the circuit board layer structure is other than a 3-2-3 structure. The below-given examples were performed on the basis of various conditions for package size and chip size which were the basic conditions of the simulation. With the below-described examples, the present inventors believe they have been able to prove that the results of the above simulation are correct.

1. Raw Material of Liquid Resin Composition

The raw materials of the liquid resin compositions for forming the insulating resin layer were as follows.

(1) Cyanate Resin 1: Novolac type cyanate resin (Lonza Japan, Primaset PT-30, Mw approx. 700)
(2) Cyanate Resin 2: Novolac type cyanate resin (Lonza Japan, Primaset PR-60, Mw approx. 2,600)
(3) Cyanate Resin 3: Bisphenol A type cyanate resin (Asahi Kasei, AroCyB-30)
(4) Epoxy Resin: Biphenyldimethylene type epoxy resin (Nippon Kayaku, NC-3000, epoxy equivalent 275)
(5) Phenol Resin: Biphenyldimethylene type phenol resin (Nippon Kayaku, GPH-103, hydroxyl equivalent 203)
(6) Phenoxy Resin 1: Copolymer of biphenylepoxy resin and bisphenol S epoxy resin with epoxy group endcap (Japan Epoxy Resin, YX-8100H30, weight average molecular weight 30000)
(7) Phenoxy Resin 2: Copolymer of bisphenol A type epoxy resin and bisphenol F type epoxy resin, with epoxy group endcap (Japan Epoxy Resin, Epicoat 4275, weight average molecular weight 60000)
(8) Curing Promoter: Imidazole compound (Shikoku Chemicals, 1-benzyl-2-phenylimidazole)
(9) Inorganic Filler 1: Spherical fused silica (Denki Kagaku Kogyo, SFP-10X, average particle size 0.3 μm)
(10) Inorganic Filler 2: Spherical fused silica (Admatechs, SO-32R, average particle size 1.5 μm)
(11) Inorganic Filler 3: Spherical fused silica (Admatechs, SO-25R, average particle size 0.5 μm)
(12) Coupling agent: Epoxyxilane type coupling agent (Nippon Unicar, A-187)

2. Preparation of Liquid Resin Composition for Forming Insulating Resin Layer

Herebelow, the amounts of the ingredients are given with the solid part as the standard.

2.1 Preparation of Liquid Resin Composition 1 for Forming Insulating Resin Layer 15 parts by weight of Cyanate Resin 1, 5 parts by weight of Cyanate Resin 2, 10 parts by weight of Epoxy Resin and 10 parts by weight of Phenol Resin were used, these being dissolved into methylethylketone at standard temperature.

Next, 10 parts by weight of Inorganic Filler 1, 50 parts by weight of Inorganic Filler 2 and 0.5 parts by weight of a coupling agent with respect to a total of 100 parts by weight of Inorganic Filler 1 and Inorganic Filler 2 were added, and a high-speed stirring apparatus was used to stir the result for 10 minutes, resulting in Liquid Resin Composition 1.

3. Production of Carrier with Insulating Resin Layer 3.1 Production of Carrier with Insulating Resin Layer A-1

A 35 μm thick, 480 mm wide polyethylene terephthalate film (Mitsubishi Polyester Film, Diafoil) as a carrier.

The above-mentioned carrier was coated with the Liquid Resin Composition 1 obtained above using a comma coater, dried for 3 minutes in a dryer at 150° C., and a 20 μm thick, 410 mm wide insulating resin layer was formed at the center of the carrier in the width direction.

The insulating resin layer side was laminated with a protective film (polyethylene) to produce a Carrier with Insulating Resin Layer A-1.

4. Production of Prepreg with Carrier

A glass fabric (Unitika Glass Fiber, E02Z-SK, width 360 mm, weight 17 g/m$^2$) was used as the fiber fabric.

Additionally, the Carriers with Insulating Resin Layer A-1 (two pieces) obtained above were used as a first and second carrier with insulating resin layer.

While peeling the protective films of the first and second carriers with insulating resin layers, the insulating resin layer sides of the carriers with insulating resin layers were placed against the surfaces of the fiber fabric so that the fiber fabric was positioned at the center of the carriers in the width direction, and attached using a laminating roller 24 at a reduced pressure of 750 Torr and 80° C.

Here, in the area inside the width direction of the fiber fabric, the insulating resin layer sides of the first and second carriers with insulating resin layers were attached to the respective surfaces of the fiber fabric, while in the area outside the width direction of the fiber fabric, the insulating resin layer sides of the first and second carriers with insulating resin layers were attached to each other.

Next, the attached product from above was passed for 2 minutes through a horizontal conveyance type hot drying apparatus set to 120° C., to subject to a heat treatment without application of pressure, resulting in a prepreg with carrier.

5. Production of Multilayer Printed Wiring Board

As an inner circuit board, a printed wiring board of insulating layer thickness 0.6 mm and with circuits of circuit thickness 12 μm, circuit width and circuit spacing L/S=50 μm/50 μm was used.

The carrier on one side of the above-described prepreg with carrier was stripped and removed to expose the insulating resin layer, with the carrier on the other side still remaining. The insulating resin layer side of the prepreg with carrier was attached to both sides of the above-described inner circuit board, and subjected to molding using a Meiki Vacuum Laminator MVLP under conditions of standard pressure to a reduced pressure of 750 Torr, 80° C., 0.5 MPa for 30 seconds, followed by 120° C., 1.5 MPa for 60 seconds. Thereafter, the board was subjected to a 1-hour heat treatment in a dryer at 200° C., to result in a 1-2-1 type multilayer printed wiring board for evaluation.

Furthermore, the above steps were repeated to produce 2-2-2 type, 3-2-3 type and 4-2-4 type multilayer printed wiring boards.

6. Production of Underfill

The raw materials of the liquid resin composition used for the underfill are as follows.

(1) Epoxy Resin 1: Bisphenol type epoxy resin (DIC, EXA-830LVP, epoxy equivalent 161)
(2) Epoxy Resin 2: Trifunctional glycidyl amine (Japan Epoxy Resin, E-630, N,N-bis(2,3-epoxypropyl)-4-(2,3-epoxypropoxy)aniline, epoxy equivalent 97.5)
(3) Hardener: Aromatic primary amine type hardener (Nippon Kayaku, Kayahard AA, 3,3'-diethyl-4,4'-diaminodiphenylmethane, amine equivalent 63.5)
(4) Silane Coupling agent: Epoxysilane coupling agent (Shin-etsu Chemical, KBM-403E, 3-glycidoxypropyltrimethoxysilane, molecular weight 236.3)
(5) Additive 1: Low stress additive (Nisseki Chemical, E-1800-6.5, number average molecular weight 1800, epoxy-modified polybutadiene rubber)
(6) Additive 2: Diluent (Wako Pure Chemical Industries, diethylene glycol monoethyl ether (DGME))
(7) Filler: Spherical synthetic silica (Admatechs, synthetic spherical silicas SE-6200 (average particle size 2.5 μm), SO-E3 (average particle size 1) and SO-E2 (average particle size 0.5 μm) mixed at a weight ratio of 45:40:15 respectively.

Using these raw materials, underfills UF-1 to UF-9 were prepared with the mixing ratios (portions by weight) shown in Table 1. Additionally, the glass transition temperatures (° C.) by TMA analysis and coefficients of thermal expansion (ppm/° C.) of the resulting underfills UF1 to UF9 were measured. The measurement results are shown in Table 1.

TABLE 1

| Contents | Generic Name | Trade Name | UF1 | UF2 | UF3 | UF4 | UF5 | UF6 | UF7 | UF8 | UF9 |
|---|---|---|---|---|---|---|---|---|---|---|---|
| Epoxy Resin | Bisphenol F epoxy resin | EXA-830 LVP | 100 | 100 | 90 | 70 | 60 | 45 | 30 | 10 | 70 |
|  | Trifunctional glycidyl amine | E-630 | 0 | 0 | 10 | 30 | 40 | 55 | 70 | 90 | 30 |
| Hardener | Aromatic primary amine hardener | Kayahard AA | 34 | 39 | 40 | 45 | 48 | 53 | 55 | 61 | 45 |
| Silane coupling agent | Epoxysilane coupling agent | KBM-403 | 5 | 5 | 5 | 5 | 5 | 5 | 5 | 5 | 5 |
| Additive | Stress reducing agent | E-1800-6.5 | 5 | 5 | 5 | 5 | 5 | 5 | 5 | 5 | 5 |
|  | Diluent | DGME | 2 | 2 | 2 | 2 | 2 | 2 | 2 | 2 | 2 |
| Filler | Spherical synthetic silica | Admatechs | 273 | 280 | 282 | 292 | 297 | 306 | 308 | 319 | 157 |
| Silica Content (wt %) | | | 65% | 65% | 65% | 65% | 65% | 65% | 65% | 65% | 50% |
| Resin Property | Glass transition temperature (° C.) | | 70 | 80 | 90 | 100 | 110 | 120 | 130 | 140 | 100 |
|  | Coefficient of thermal expansion (ppm/° C.) | | 27 | 27 | 26 | 26 | 26 | 26 | 26 | 25 | 37 |

6. Production of Semiconductor Package

Further, the 1-2-1 type, 2-2-2 type, 3-2-3 type and 4-2-4 type multilayer printed wiring boards, underfill resins UF1-UF9 and silicon chips were used to produce semiconductor packages by flip-chip mounting in the combinations shown in Tables 2-6.

The resulting semiconductor packages were subjected to SAT observation and conductivity tests. The results are shown in Tables 2-6. Aside from Comparative Example 5, all of the semiconductor packages used the core and buildup layer compositions shown in Table 7.

TABLE 2

|  | Ex. 1 | Ex. 2 |
|---|---|---|
| Substrate Structure | 1-2-1 structure | 1-2-1 structure |
| Core Thickness | 0.4 | 0.4 |
| Core CTE (ppm/° C.) in planar direction | 11 | 11 |
| Core CTE (ppm/° C.) in thickness direction | 16 | 16 |
| Buildup CTE (ppm/° C.) | 30 | 30 |
| Tg Range when substituting Substrate Structure/Thickness | 95-145 | 95-145 |
| Underfill Composition | UF2 | UF8 |
| Tg (° C.) | 80 | 140 |
| CTE (ppm/° C.) | 27 | 26 |
| Semiconductor Reliability Test | | |
| SAT Observation | pass | pass |
| Conductivity Test Result | pass | pass |

TABLE 3

|  | Ex. 3 | Ex. 4 | Ex. 5 | Ex. 6 | Ex. 7 | Ex. 8 | Ex. 9 |
|---|---|---|---|---|---|---|---|
| Substrate Structure | 2-2-2 substrate | 2-2-2 substrate | 2-2-2 substrate | 2-2-2 substrate | 2-2-2 substrate | 2-2-2 substrate | 2-2-2 substrate |
| Core Thickness | 0.2 | 0.2 | 0.2 | 0.2 | 0.4 | 0.4 | 0.4 |
| Core CTE (ppm/° C.) in planar direction | 11 | 11 | 11 | 11 | 11 | 11 | 11 |
| Core CTE (ppm/° C.) in thickness direction | 16 | 16 | 16 | 16 | 16 | 16 | 16 |
| Buildup CTE (ppm/° C.) | 30 | 30 | 30 | 30 | 30 | 30 | 30 |
| Tg Range when substituting Substrate Structure/Thickness | 80-115 | 80-115 | 80-115 | 80-115 | 85-135 | 85-135 | 85-135 |
| Underfill Composition | UF2 | UF3 | UF4 | UF5 | UF2 | UF4 | UF7 |
| Tg (° C.) | 80 | 90 | 100 | 110 | 80 | 100 | 130 |
| CTE (ppm/° C.) | 27 | 26 | 26 | 26 | 27 | 26 | 25 |
| Semiconductor Reliability Test | | | | | | | |
| SAT Observation | pass | pass | pass | pass | pass | Pass | pass |
| Conductivity Test Result | pass | pass | pass | pass | pass | Pass | pass |

TABLE 4

|  | Ex. 10 | Ex. 11 | Ex. 12 | Ex. 13 | Ex. 14 | Ex. 15 | Ex. 16 | Ex. 17 | Ex. 18 | Ex. 19 | Ex. 20 | Ex. 21 |
|---|---|---|---|---|---|---|---|---|---|---|---|---|
| Substrate Structure | 3-2-3 substrate | 3-2-3 substrate | 3-2-3 substrate | 3-2-3 substrate | 3-2-3 substrate | 3-2-3 substrate | 3-2-3 substrate | 3-2-3 substrate | 3-2-3 substrate | 3-2-3 substrate | 3-2-3 substrate | 3-2-3 substrate |
| Core Thickness | 0.1 | 0.1 | 0.1 | 0.2 | 0.2 | 0.2 | 0.2 | 0.4 | 0.4 | 0.4 | 0.4 | 0.4 |
| Core CTE (ppm/° C.) in planar direction | 11 | 11 | 11 | 11 | 11 | 11 | 11 | 11 | 11 | 11 | 11 | 11 |
| Core CTE (ppm/° C.) in thickness direction | 16 | 16 | 16 | 16 | 16 | 16 | 16 | 16 | 16 | 16 | 16 | 16 |
| Buildup CTE (ppm/° C.) | 30 | 30 | 30 | 30 | 30 | 30 | 30 | 30 | 30 | 30 | 30 | 30 |
| Tg Range when substitute Substrate Structure/Thickness | 77.5-105 | 77.5-105 | 77.5-105 | 80-115 | 80-115 | 80-115 | 80-115 | 80-115 | 80-115 | 80-115 | 80-115 | 80-115 |
| Underfill Composition | UF2 | UF3 | UF4 | UF2 | UF3 | UF4 | UF5 | UF2 | UF3 | UF4 | UF5 | UF7 |
| Tg (° C.) | 80 | 90 | 100 | 80 | 90 | 100 | 110 | 80 | 90 | 100 | 110 | 130 |
| CTE (ppm/° C.) | 27 | 26 | 26 | 27 | 26 | 26 | 26 | 27 | 26 | 26 | 26 | 25 |
| Semiconductor Reliability Test | | | | | | | | | | | | |
| SAT Observation | pass | pass | pass | pass | pass | pass | pass | pass | pass | pass | pass | pass |
| Conductivity Test Result | pass | pass | pass | pass | pass | pass | pass | pass | pass | pass | pass | pass |

TABLE 5

|  | Ex. 22 | Ex. 23 |
|---|---|---|
| Substrate Structure | 4-2-4 substrate | 4-2-4 substrate |
| Core Thickness | 0.4 | 0.4 |
| Core CTE (ppm/° C.) in planar direction | 11 | 11 |
| Core CTE (ppm/° C.) in thickness direction | 16 | 16 |
| Buildup CTE (ppm/° C.) | 30 | 30 |
| Tg Range when substituting Substrate Structure/Thickness | 75-125 | 75-125 |
| Underfill Composition | UF2 | UF6 |
| Tg (° C.) | 80 | 120 |
| CTE (ppm/° C.) | 27 | 26 |
| Semiconductor Reliability Test | | |
| SAT Observation | pass | pass |
| Conductivity Test Result | pass | pass |

TABLE 6

|  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|
| Substrate Structure | 3-2-3 substrate | 3-2-3 substrate | 3-2-3 substrate | 3-2-3 substrate | 3-2-3 substrate | 3-2-3 substrate |
| Core Thickness | 0.4 | 0.1 | 0.2 | 0.4 | 0.2 | 0.2 |
| Core CTE (ppm/° C.) in planar direction | 11 | 11 | 11 | 11 | 15 | 11 |
| Core CTE (ppm/° C.) in thickness direction | 16 | 16 | 16 | 16 | 25 | 16 |
| Buildup CTE (ppm/° C.) | 30 | 30 | 30 | 30 | 46 | 30 |
| Tg Range when substituting Substrate Structure/Thickness | 85-135 | 77.5-105 | 80-115 | 85-135 | 80-115 | 80-115 |
| Underfill Composition | UF1 | UF5 | UF6 | UF8 | UF3 | UF9 |
| Tg (° C.) | 70 | 110 | 120 | 140 | 90 | 90 |
| CTE (ppm/° C.) | 27 | 26 | 26 | 25 | 26 | 37 |
| Semiconductor Reliability Test | | | | | | |
| SAT Observation | pass | fail (chip cracked) | fail (chip cracked) | fail (chip cracked) | fail (chip cracked) | fail (delaminated) |
| Conductivity Test Result | fail | fail | fail | fail | fail | fail |

TABLE 7

| Resin | Trade Name | Parts by Weight Core | Parts by Weight Buildup |
|---|---|---|---|
| Cyanate Resin | Novolac type cyanate resin: Lonza, Primaset PT-30, weight average molecular weight 700 | 19.7 | 25.0 |
| Epoxy Resin | Biphenyldimethylene type epoxy resin: Nippon Kayaku, NC-3000, epoxy equivalent 275, weight average molecular wegith 2000 | 11.0 | 24.7 |
| Phenoxy Resin | Copolymer of biphenylepoxy resin and bisphenol S epoxy resin with epoxy endcaps: Japan Epoxy Resin, YX-8100H30, weight average molecular weight 30,000 | | 10.0 |

TABLE 7-continued

| Resin | Trade Name | Parts by Weight Core | Parts by Weight Buildup |
|---|---|---|---|
| Hardener | Biphenyldimethylene type phenol resin: Meiwa Kasei, MEH-7851-3H, hydroxyl equivalent 230 | 9.0 | |
| Curing Catalyst | Imidazole compound: Shikoku Kasei, 1B2PZ, 1-benzyl-2-phenylimidazole | | 0.1 |
| Inorganic Filler | Spherical fused silica: Admatechs, SO-25H, average particle size 0.5 μm | 60 | 40 |
| Coupling agent | Epoxysilane coupling agent: GE Toshiba Silicone, A-187 | 0.3 | 0.2 |

<Summary of Evaluation Results>

FIG. 8 is a graph for explaining the results of thermal cycling tests on a thin FC-BGA type semiconductor device use a 1-2-1 type interposer. The experiment was performed under conditions wherein the coefficient of thermal expansion of the underfill was fixed at 26 ppm/° C. The horizontal axis of this graph represents the thickness (mm) of the core and the vertical axis represents the glass transition temperature (° C.) of the underfill by TMA analysis. The same applies to FIGS. 9 to 11 described below.

The evaluated categories were (i) low-k film protection of the silicon chip 102, (ii) protection of the solder bumps 100, (iii) reduction in warpage of the silicon chip 102 and (iv) protection against delamination of the filler 7 of the underfill 112 on the side surfaces of the silicon chip 102. In the graph, a black circle indicates that a defect occurred in one of the categories in the experiment, a grey circle indicates that the resistance was high but there were no cracks and therefore that the sample passed, and a white circle indicates that the sample passed all categories. The same applies to FIGS. 9 to 11 described below.

As can be seen in this graph, the glass transition temperature $Tg$ (° C.) of the underfill by TMA analysis satisfies the relationship $75 \leq Tg < 112.5T + 95$ where $T$ (mm) is the thickness of the core. Additionally, the equation $25T + 75 \leq Tg \leq 100T + 95$ which is an even stricter condition is also satisfied. Furthermore, since the number of buildup layers in a 1-2-1 type interposer is three layers or less, it also satisfies the equation $50T+75 \leq Tg<125T+95$.

FIG. 9 is a graph for explaining the results of thermal cycling tests in a thin FC-BGA type semiconductor device using a 2-2-2 type interposer. The experiment was performed under conditions wherein the coefficient of thermal expansion of the underfill was fixed at 26 ppm/° C.

As can be seen in this graph, the glass transition temperature Tg (° C.) of the underfill by TMA analysis satisfies the relationship $75 \leq Tg<112.5T+95$, as in the case of the 1-2-1 type. Additionally, the equation $25T+75 \leq Tg \leq 100T+95$ which is an even stricter condition is also satisfied. Furthermore, since the number of buildup layers in a 2-2-2 type interposer is at least four layers and at most six layers, it also satisfies the equation $25T+75 \leq Tg \leq 100T+95$.

FIG. 10 is a graph for explaining the results of thermal cycling tests in a thin FC-BGA type semiconductor device using a 3-2-3 type interposer. The experiment was performed under conditions wherein the coefficient of thermal expansion of the underfill was fixed at 26 ppm/° C.

As can be seen in this graph, the glass transition temperature Tg (° C.) of the underfill by TMA analysis satisfies the relationship $75 \leq Tg<112.5T+95$, as in the case of the 1-2-1 type and the 2-2-2 type. Additionally, the equation $25T+75 \leq Tg \leq 100T+95$ which is an even stricter condition is also satisfied. Furthermore, since the number of buildup layers in a 2-2-2 type interposer is at least four layers and at most six layers, it also satisfies the equation $25T+75 \leq Tg \leq 100T+95$.

FIG. 11 is a graph for explaining the results of thermal cycling tests in a thin FC-BGA type semiconductor device using a 4-2-4 type interposer. The experiment was performed under conditions wherein the coefficient of thermal expansion of the underfill was fixed at 26 ppm/° C.

As can be seen in this graph, the glass transition temperature Tg (° C.) of the underfill by TMA analysis satisfies the relationship $75 \leq Tg<112.5T+95$, as in the case of the 1-2-1 type, the 2-2-2 type and the 3-2-3 type. Additionally, the equation $25T+75 \leq Tg \leq 100T+95$ which is an even stricter condition is also satisfied. Furthermore, since the number of buildup layers in a 2-2-2 type interposer is at least seven layers, it also satisfies the equation $75 \leq Tg \leq 75T+95$.

The experimental results given above confirm that samples in experimental conditions containing the optimal regions in the simulation results actually satisfy the four requisites of (i) low-k film protection of the silicon chip 102, (ii) protection of the solder bumps 110, (iii) reduction in warpage of the silicon chip 102 and (iv) protection against delamination of the fillet of the underfill 112 on the side surfaces of the silicon chip 102, thus demonstrating that the simulation results are reliable.

Additionally, it was found that the equation $75 \leq Tg<112.5T+95$ was satisfied in each of the cases of the 1-2-1 type, the 2-2-2 type, the 3-2-3 type and the 4-2-4 type. Additionally, in each case, the equation $25T+75 \leq Tg \leq 100T+95$, which is a stricter condition, was also satisfied. That is, these equations were found to be satisfied regardless of the interposer layer structure.

Furthermore, when the number of buildup layers in the interposer was three or less, it was found that the equation $50T+75 \leq Tg<125T+95$, which partially covers a wider range than the equation $75 \leq Tg<112.5T+95$, was also satisfied. However, even in this case, when the number of buildup layers in the interposer was three or less, satisfaction of the equation $75 \leq Tg<112.5T+95$ was not denied or contradicted.

As described above, the present invention has been explained based on examples thereof. These examples are no more than examples, and those skilled in the art will recognize that various other modifications are possible, and that such modifications also belong within the scope of the present invention.

INDUSTRIAL APPLICABILITY

As described above, the semiconductor device of the present invention is capable of suppressing damage to the semiconductor device due to temperature changes, and is useful for improving the reliability of high-density mounting for achieving compactness, light weight and high performance in cellular telephones, digital video cameras and digital still cameras.

The invention claimed is:

1. A semiconductor device comprising:
 a circuit board comprising a core and a buildup layer;
 a semiconductor element connected to said circuit board via metal bumps;
 a gap between said semiconductor element and said circuit board; and
 an encapsulating resin composition filling the gap between said semiconductor element and said circuit board;
 wherein the thickness of said core is at most 500 μm;
 said core is formed by impregnating a fiber substrate with a resin composition comprising a cyanate resin, a phenol resin, an epoxy resin and an inorganic filler, and curing;
 the coefficient of thermal expansion of said encapsulating resin composition from room temperature to the glass transition temperature is at least 15 ppm/° C. and at most 30 ppm/° C.; and
 the glass transition temperature Tg (° C.) by TMA analysis of said encapsulating resin composition satisfies the equation $75<Tg<112.5T+95$, where T (mm) is the thickness of said core.

2. A semiconductor device according to claim 1, wherein the thickness of said core is at most 200 pm.

3. A semiconductor device according to claim 1, wherein the coefficient of thermal expansion in the planar direction of said buildup layer from room temperature to the glass transition temperature is at most 35 ppm/° C.

4. A semiconductor device according to claim 1, wherein the glass transition temperature Tg (° C.) by TMA of said encapsulating resin composition satisfies the equation $25T+75<Tg<100T+95$, where T (mm) is the thickness of said core.

5. A semiconductor device according to claim 1, wherein said circuit board comprises at least seven buildup layers, and the glass transition temperature Tg (° C.) by TMA of said encapsulating resin composition satisfies the equation $75<Tg<75T+95$, where T (mm) is the thickness of said core.

6. A semiconductor device according to claim 1, wherein said circuit board comprises at least four and at most six buildup layers, and the glass transition temperature Tg (° C.) by TMA of said encapsulating resin composition satisfies the equation $25T+75<Tg<100T+95$, where T (mm) is the thickness of said core.

7. A semiconductor device comprising:
 a circuit board comprising a core and a buildup layer;
 a semiconductor element connected to said circuit board via metal bumps;
 a gap between said semiconductor element and said circuit board; and an encapsulating resin composition filling the gap between said semiconductor element and said circuit board;

wherein said circuit board comprises at most three buildup layers;

the thickness of said core is at most 500 μm;

said core is formed by impregnating a fiber substrate with a resin composition comprising a cyanate resin, a phenol resin, an epoxy resin and an inorganic filler, and curing;

the coefficient of thermal expansion of said encapsulating resin composition from room temperature to the glass transition temperature is at least 15 ppm/° C. and at most 30 ppm/° C.; and the glass transition temperature Tg (° C.) by TMA analysis of said encapsulating resin composition satisfies the equation $50T+75<Tg<125T+95$, where T (mm) is the thickness of said core.

* * * * *